United States Patent
Johnson et al.

(10) Patent No.: US 7,101,805 B2
(45) Date of Patent: Sep. 5, 2006

(54) ENVELOPE FOLLOWER END POINT DETECTION IN TIME DIVISION MULTIPLEXED PROCESSES

(75) Inventors: David Johnson, Palm Harbor, FL (US); Russell Westerman, Largo, FL (US)

(73) Assignee: Unaxis USA Inc., St. Petersburg, FL (US)

( * ) Notice: Subject to any disclaimer, the term of this patent is extended or adjusted under 35 U.S.C. 154(b) by 179 days.

(21) Appl. No.: 10/841,818

(22) Filed: May 6, 2004

(65) Prior Publication Data

US 2004/0238489 A1    Dec. 2, 2004

Related U.S. Application Data

(60) Provisional application No. 60/469,333, filed on May 9, 2003.

(51) Int. Cl.
  *H01L 21/302* (2006.01)
(52) U.S. Cl. .............. 438/706; 438/718; 438/719
(58) Field of Classification Search ............ 438/706, 438/710, 714, 718, 719
  See application file for complete search history.

(56) References Cited

U.S. PATENT DOCUMENTS

| | | | |
|---|---|---|---|
| 4,491,499 A | 1/1985 | Jerde et al. | |
| 4,528,438 A | 7/1985 | Poulsen et al. | |
| 4,795,529 A | 1/1989 | Kawasaki et al. | |
| 4,985,114 A | 1/1991 | Okudaira et al. | |
| 5,160,402 A | 11/1992 | Cheng | |
| 5,308,414 A | 5/1994 | O'Neill et al. | |
| 5,343,412 A | 8/1994 | Birang | |
| 5,362,356 A * | 11/1994 | Schoenborn | 216/60 |
| 5,501,893 A | 3/1996 | Laermer et al. | |
| 5,626,714 A | 5/1997 | Miyazaki et al. | |
| 5,658,423 A | 8/1997 | Angell et al. | |
| 5,739,051 A | 4/1998 | Saito | |
| 5,810,963 A * | 9/1998 | Tomioka | 156/345.28 |
| 5,928,532 A | 7/1999 | Koshimizu et al. | |
| 5,980,767 A | 11/1999 | Koshimizu et al. | |
| 6,046,796 A | 4/2000 | Markle et al. | |
| 6,060,328 A | 5/2000 | En et al. | |

(Continued)

FOREIGN PATENT DOCUMENTS

JP   63005529   1/1988

(Continued)

OTHER PUBLICATIONS

David A. White, Brian E. Goodlin, Aaron E. Gower, Duane S. Boning, Member, IEEE, Han Chen, Herbert H. Sawin, and Timothy J. Dalton, Low Open-Area Endpoint Detection Using a PCA-Based T2 Statistic and Q Statistic on Optical Emission Spectroscopy Measurements, IEEE Transactions on Semiconductor Manufacturing, vol. 13, No. 2, May 2000.

(Continued)

*Primary Examiner*—Nadine G. Norton
*Assistant Examiner*—Binh X. Tran
(74) *Attorney, Agent, or Firm*—Holland & Knight LLP

(57) ABSTRACT

The present invention provides a method and an apparatus for establishing endpoint during an alternating cyclical etch process or time division multiplexed process. A substrate is placed within a plasma chamber and subjected to an alternating cyclical process having an etching step and a deposition step. A variation in plasma emission intensity is monitored using known optical emission spectrometry techniques. An amplitude information is extracted from a complex waveform of the plasma emission intensity using an envelope follower algorithm. The alternating cyclical process is discontinued when endpoint is reached at a time that is based on the monitoring step.

47 Claims, 25 Drawing Sheets

U.S. PATENT DOCUMENTS

| | | | |
|---|---|---|---|
| 6,153,115 | A | 11/2000 | Le et al. |
| 6,200,822 | B1 | 3/2001 | Becker et al. |
| 6,207,008 | B1 | 3/2001 | Kijima |
| 6,231,774 | B1 | 5/2001 | Saito |
| 6,238,937 | B1 | 5/2001 | Toprac et al. |
| 6,358,760 | B1 | 3/2002 | Huang et al. |
| 6,368,975 | B1 * | 4/2002 | Balasubramhanya et al. .................. 438/706 |
| 6,419,846 | B1 | 7/2002 | Toprac et al. |
| 6,492,186 | B1 | 12/2002 | Han et al. |
| 6,564,114 | B1 | 5/2003 | Toprac et al. |
| 6,582,618 | B1 | 6/2003 | Toprac et al. |
| 6,586,262 | B1 | 7/2003 | Saito et al. |
| 6,649,075 | B1 | 11/2003 | Buie et al. |
| 2002/0148811 | A1 | 10/2002 | Ni et al. |
| 2003/0036282 | A1 | 2/2003 | Usui et al. |
| 2003/0043383 | A1 * | 3/2003 | Usui et al. .................. 356/504 |
| 2003/0085198 | A1 | 5/2003 | Yi et al. |

FOREIGN PATENT DOCUMENTS

WO    WO 91/18283    11/1991

OTHER PUBLICATIONS

H. Bissell, Envelope follower combines fast response, low ripple, EDN, Dec. 26, 2002, pp. 59-60.

* cited by examiner

TDM Process
Plasma Emission Spectrum
Etch B Spectra

Plasma Emission vs Time
TDM Etch Process
Peak-Hold with Reset

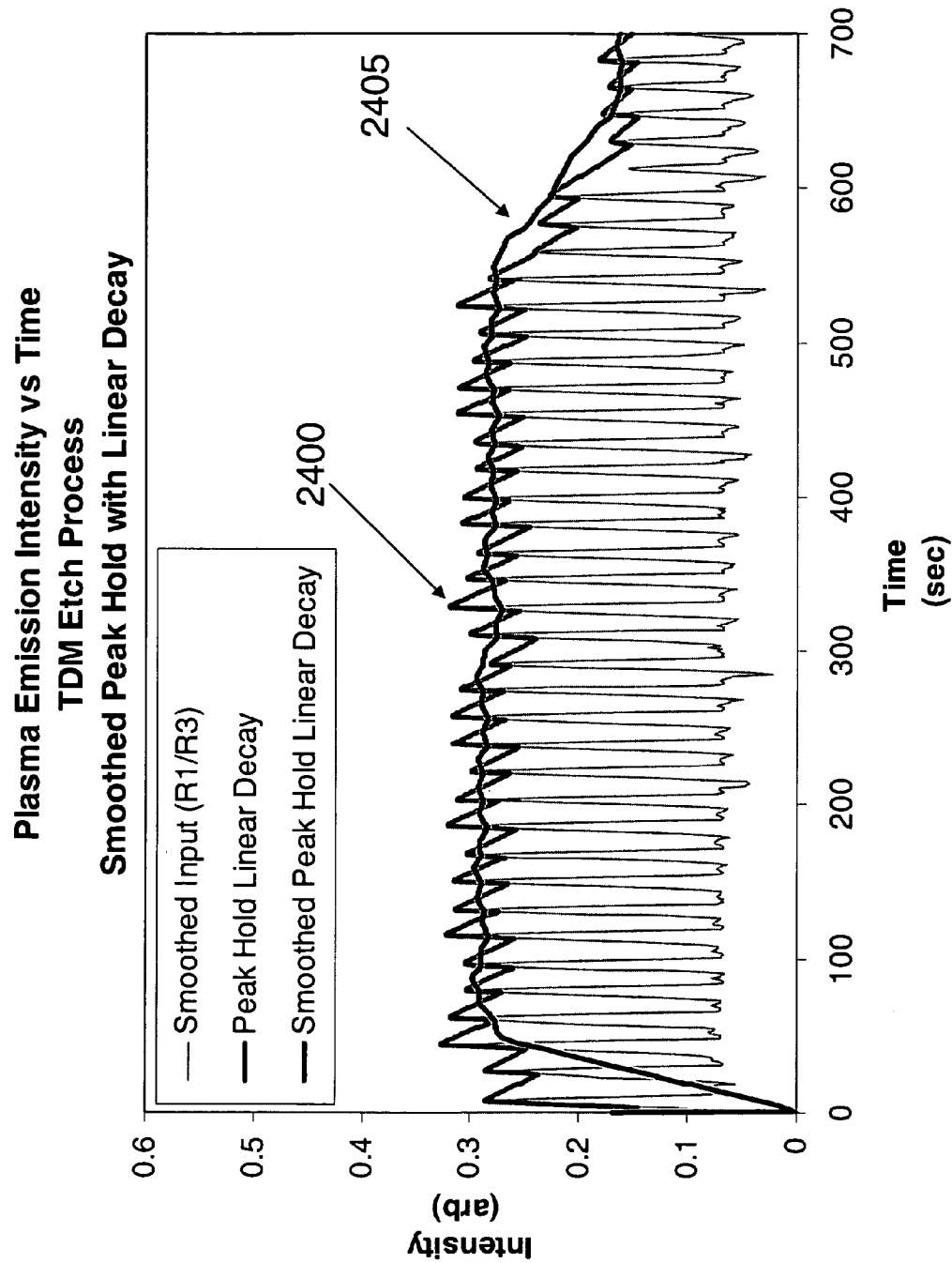

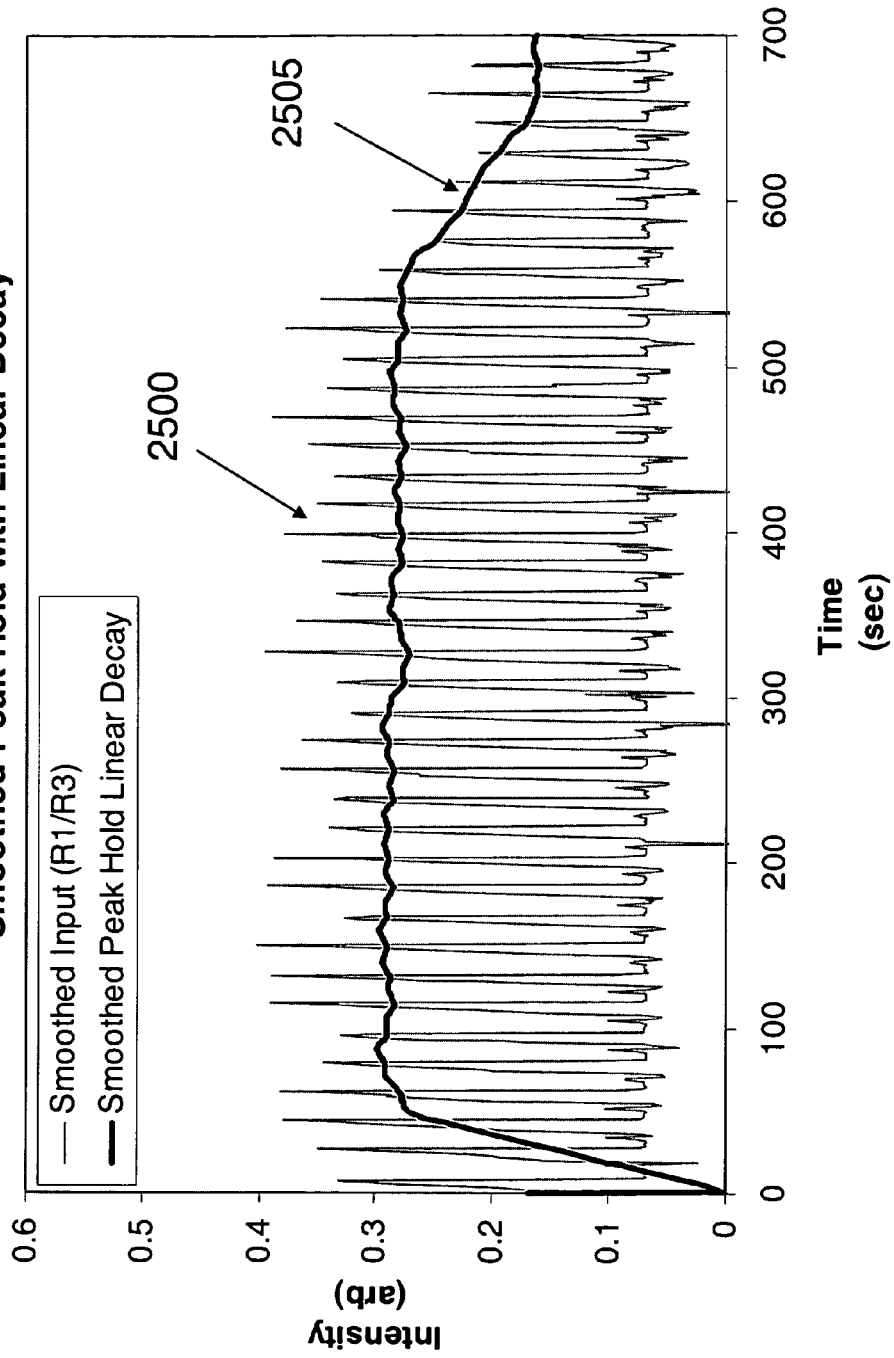

ENVELOPE FOLLOWER END POINT DETECTION IN TIME DIVISION MULTIPLEXED PROCESSES

CROSS REFERENCES TO RELATED APPLICATIONS

This application claims priority from and is related to commonly owned U.S. Provisional Patent Application Ser. No. 60/469,333 filed May 9, 2003, entitled: Envelope Follower End Point Detection in Time Division Multiplexed Processes, this Provisional Patent Application incorporated by reference herein.

FIELD OF THE INVENTION

The present invention generally relates to the field of semiconductor wafer processing. More particularly, the present invention is directed to determining the endpoint of etching processes during a time division multiplexed etching and deposition process.

BACKGROUND OF THE INVENTION

During the fabrication of many micro-electro-mechanical (MEMS) devices it is required to etch a layer of material to completion stopping on the layer below (e.g., Silicon on Insulator (SOI)—clearing a silicon (Si) layer stopping on an underlying silicon dioxide ($SiO_2$) layer). Allowing the etch process to proceed beyond the time when the first layer has been removed can result in reduced thickness of the underlying stop layer, or feature profile degradation (known in the art as "notching" for SOI applications).

As a result, it is crucial in a plasma processing process such as etching that the endpoint of the plasma processing be judged accurately to end the plasma processing with no delay. As a method for detecting the endpoint of plasma processing, a method in which any change in the light spectrum of a specific substance contained within the plasma in the processing chamber is detected, with the endpoint being detected based upon such change, is well known in the art. This method, which is conceived from the observation that the contents in the plasma change as the etching on the substrate progresses, aims to detect a real-time endpoint of the etching process accurately by monitoring a change in the intensity of the light spectrum of a specific substance. This method commonly used to detect plasma process termination times is optical emission spectrometry (OES).

OES analyzes the light emitted from a plasma source to draw inferences about the chemical and physical state of the plasma process. In semiconductor processing this technique is commonly used to detect material interfaces during plasma etch processes. The OES technique involves monitoring the radiation emitted by the plasma, usually in the ultra violet/visible range (200 nm–1100 nm) portion of the light spectrum. FIG. 1 shows a schematic view of a typical OES configuration. The composition of the plasma, and in particular the presence of reactive etch species or etch by-products, will determine the spectra (i.e., intensity vs. wavelength) of the emitted radiation. During the course of an etch process, and especially at a material transition, the composition of the plasma changes, resulting in a change in the emission spectrum. By continuously monitoring the plasma emission, it is possible for an OES endpoint system to detect that change and use it to determine when the film has completely cleared. For example, when the OES signal drops below a pre-determined threshold level, this transition is used to trigger "endpoint". In practice, most of the information relating to endpoint is usually contained within a few wavelengths that correspond to reactants consumed or the etch by-products that are generated during the etch.

A common method to develop an OES endpoint strategy is to collect a number of spectra of the plasma emission (emission intensity v. wavelength) during both pre-endpoint and post-endpoint conditions. Endpoint wavelength candidate regions can be determined using a number of methods. Spectral regions for endpoint detection can be chosen through statistical methods such as factor analysis or principal component analysis (see U.S. Pat. No. 5,658,423 to Angell et al.). Another strategy to determine endpoint candidates is through the construction of a difference plot between pre-endpoint (main etch) and post-endpoint (over etch) spectra. Once candidate regions have been selected, assignments of likely chemical species are made for the candidate regions (i.e., reactant species from dissociated gas precursors or etch products). The assignment is not critical in determining success of the strategy, but rather assists in understanding and optimizing the wavelength selection process. A number of references including *Tables of Spectral Lines* by Zaidel et al. and *The Identification of Molecular Spectra* by Pearse et al. in conjunction with knowledge of the process chemistry can be used to assign likely species identities for the candidate lines. An example of likely endpoint candidates for a silicon etch. process in a sulfur hexafluoride ($SF_6$) plasma would be fluorine (F) lines at 687 nm and 703 nm as well as the silicon fluoride (SiF) emission band at 440 nm. Once these regions have been determined, subsequent parts can be processed using the same OES strategy.

While these OES approaches work well for single step processes or processes with a limited number of discrete etch steps (such as an etch initiation followed by a main etch), it is difficult to apply OES to plasma processes with rapid and periodic plasma perturbations. Examples of such time division multiplexed (TDM) processes are disclosed in U.S. Pat. No. 5,501,893 to Laermer et al., U.S. Pat. No. 4,985,114 to Okudaira et al., and U.S. Pat. No. 4,795,529 to Kawasaki et al. Laermer et al. disclose a TDM process for etching high aspect ratio features into Si using an alternating series of etch and deposition steps.

FIGS. 2(*a*) to 2(*d*) are pictorial examples of one type of the TDM process for deep silicon etching. The TDM Si etch process is typically carried out in a reactor configured with a high-density plasma source, typically an Inductively Coupled Plasma (ICP), in conjunction with a radio frequency (RF) biased substrate electrode. The most common process gases used in the TDM etch process for Si are sulfur hexafluoride ($SF_6$) and octofluorocyclobutane ($C_4F_8$). $SF_6$ is typically used as the etch gas and $C_4F_8$ as the deposition gas. During the etch step, $SF_6$ facilitates spontaneous and isotropic etching of Si (FIGS. 2(*a*) and 2(*b*)); in the deposition step, $C_4F_8$ facilitates protective polymer deposition onto the sidewalls as well as the bottom of etched structures (FIG. 2(*c*)). The TDM Si etch process cyclically alternates between etch and deposition process steps enabling high aspect ratio structures to be defined into a masked Si substrate. Upon energetic and directional ion bombardment to the Si substrate, which is present in etch steps, the polymer film coated in the bottom of etched structures from the previous deposition step will be removed to expose the Si surface for further etching (FIG. 2(*d*)). The polymer film on the sidewall of the etched structures will remain because it is not subjected to direct ion bombardment, inhibiting lateral etching. Using the TDM Si etch approach allows high aspect ratio features to be defined into Si substrates at high etch rates. FIG. 2(e) shows a scanning electron microscope (SEM) image of a cross section of a silicon structure etched using a TDM process.

As shown in FIG. 3, the plasma emission spectra of etch 300 and deposition 305 steps in a TDM Si etch process are dramatically different due to the different plasma conditions that exist in the deposition and etch steps (e.g., process gas types, pressures, RF powers, etc.). As shown in FIG. 4, applying conventional OES methods to a TDM silicon etch process results in an end point trace 400 that is periodic, and cannot be used to detect endpoint. For the TDM Si etch, it is expected that the majority of the etch endpoint information is contained within the etch segments of the process.

U.S. Pat. No. 6,200,822 to Becker et al. shows a method to extract endpoint information from the plasma emission of a TDM Si etch process. Becker et al. examine the emission intensity of at least one species (typically F or SiF for an Si etch) in the plasma only during the etch step through the use of an externally supplied trigger (typically the transition from one process step to the next). By using an external trigger in conjunction with a delay function and a sample-and-hold (peak-hold) circuit, the emission intensity observed in subsequent etch steps can be stitched together to obtain an emission signal that is not periodic in nature. The value of the emission intensity for the species in the etch step is held at the last known value during the ensuing deposition step. In this manner the periodic emission signal is converted into a curve similar to a step function that can be used for process endpoint determination. The limitations of this approach are the need for an externally supplied trigger, in addition to the need for a user input delay between the trigger and acquiring the emission data during etch steps.

In an effort to increase the OES method sensitivity U.S. Pat. No. 4,491,499 to Jerde et al. disclose measuring a narrow band of the emission spectrum while simultaneously measuring the intensity of a wider background band centered about the narrow band. In this manner the background signal can be subtracted from the endpoint signal resulting in a more accurate value of the narrow band signal.

Therefore, there is a need for an endpoint strategy for TDM plasma processes that does not require an external trigger and a user input delay past the trigger to synchronize the plasma emission data collection with the process steps.

Nothing in the prior art provides the benefits attendant with the present invention.

Therefore, it is an object of the present invention to provide an improvement which overcomes the inadequacies of the prior art devices and which is a significant contribution to the advancement of the semiconductor processing art.

Another object of the present invention is to provide a method for etching a feature in a substrate comprising the steps of: subjecting the substrate to an alternating process within a plasma chamber; monitoring a variation in plasma emission intensity; extracting an amplitude information from said plasma emission intensity using an envelope follower algorithm; and discontinuing said alternating process at a time based on said monitoring step.

Yet another object of the present invention is to provide a method of establishing endpoint during a time division multiplex process comprising the steps of: subjecting a substrate to the time division multiplex process; monitoring an attribute of a signal generated from the time division multiplex process; processing said attribute of the periodic signal generated from the time division multiplex process using an envelope follower; and discontinuing the time division multiplex process at a time based on the processing step.

Still yet another object of the present invention is to provide a method for establishing endpoint during a time division multiplexed process, the method comprising the steps of: etching a surface of a substrate in an etching step by contact with a reactive etching gas to removed material from the surface of the substrate and provide exposed surfaces; passivating the surface of the substrate in a passivating step during which the surfaces that were exposed in the preceding etching step are covered by a passivation layer thereby forming a temporary etching stop; alternatingly repeating the etching step and the passivating step; analyzing an intensity of at least one wavelength region of a plasma emission through the use of an envelope follower algorithm; and discontinuing the time division multiplexed process at a time which is dependent on said analysis step.

Another object of the present invention is to provide a method of establishing endpoint during a time division multiplex process comprising the steps of: subjecting a substrate to the time division multiplex process; monitoring an attribute of a signal generated from the time division multiplex process; processing said attribute of the periodic signal generated from the time division multiplex process using a peak-hold and decay algorithm; and discontinuing the time division multiplex process at a time based on the processing step.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

For the purpose of summarizing this invention, this invention comprises a method and an apparatus for establishing endpoint during an alternating cyclical etch process or time division multiplexed process. Note, the plasma emission intensity of the process can be periodic.

A feature of the present invention is to provide a method for etching a feature in a substrate. The substrate to be etched can contain silicon or a group-III element and/or a group-V element such as Gallium Arsenide. The method comprising the following steps. The substrate is placed within a plasma chamber and subjected to an alternating process. The alternating process can comprise only etch steps, only deposition steps, at least one etch step and at least one deposition step, or a plurality of etching steps and a plurality of deposition steps. In addition, at least one process parameter can vary over time within the alternating cyclical process. A variation in plasma emission intensity is monitored using known optical emission spectrometry techniques. The monitoring can be of a plurality of regions of plasma emission intensity. The plurality of regions of plasma emission intensity can be chosen using a statistical method such as factor analysis or through an off-line analysis. The off-line analysis can be determined by the use of spectra differencing. In addition, the plurality of regions of plasma emission intensity can be background corrected. Mathematical operations can be performed on multiple regions of plasma emission intensity. An amplitude information is extracted from a complex waveform of the plasma emission intensity using an envelope follower algorithm. The envelope follower algorithm can use a plurality of peak detect algorithms and can be reset sequentially in a round robin fashion. Further, the reset can be based a clock period that is longer than the half period of the lowest frequency of interest. The alternating process is discontinued when endpoint is reached at a time that is based on the monitoring step.

Yet another feature of the present invention is to provide a method of establishing endpoint during a time division multiplex process. The method comprising the following steps. A substrate is subjected to the time division multiplex process within a vacuum chamber. An attribute, such as emission intensity or plasma impedance, of a periodic signal that is generated by the time division multiplex process is monitored using known optical emission spectrometry techniques. The monitoring can be of a plurality of regions of plasma emission intensity. The plurality of regions of plasma emission intensity can be chosen using a statistical method such as factor analysis or through an off-line analysis. The off-line analysis can be determined by the use of spectra differencing. In addition, the plurality of regions of plasma emission intensity can be background corrected. Mathematical operations can be performed on multiple regions of plasma emission intensity. The attribute of the periodic signal that is generated by the time division multiplex process is processed using an envelope follower algorithm. The envelope follower algorithm can use a plurality of peak detect algorithms, can be reset sequentially in a round robin fashion, and can be processed in parallel. Further, the reset can be based a clock period that is at least half the process period of the time division multiplex process. In addition, further processing can be conducted on the extracted amplitude detection signal, including digital signal processing that is filtered using an infinite impulse response filter or a finite impulse response filter. The time division multiplex process is discontinued when endpoint is reached at a time that is based on the processing step.

Still yet another feature of the present invention is to provide a method for establishing endpoint during a time division multiplexed process. The method comprising the following steps. A substrate is subjected to time division multiplexed process within a vacuum chamber. A surface of the substrate is anisotropically etched in an etching step by contact with a reactive etching gas to removed material from the surface of the substrate and provide exposed surfaces. Then, the surface of the substrate is passivated during a passivating step where the surfaces that were exposed in the preceding etching step are covered by a passivation layer thereby forming a temporary etching stop. The etching step and the passivating step are alternatingly repeated for the length of the time division multiplexed process. The intensity of at least one wavelength region of the plasma emission is monitored using known optical emission spectrometry techniques and analyzed through the use of an envelope follower algorithm. The time division multiplexed process is discontinued when endpoint is reached at a time that is based on the analysis step.

Another feature of the present invention is to provide a method of establishing endpoint during a time division multiplex process. The method comprising the following steps. A substrate is subjected to the time division multiplex process within a vacuum chamber. An attribute, such as emission intensity or plasma impedance, of a periodic signal that is generated by the time division multiplex process is monitored using known optical emission spectrometry techniques. The monitoring can be of a plurality of regions of plasma emission intensity. The plurality of regions of plasma emission intensity can be chosen using a statistical method such as factor analysis or through an off-line analysis. The off-line analysis can be determined by the use of spectra differencing. In addition, the plurality of regions of plasma emission intensity can be background corrected. Mathematical operations can be performed on multiple regions of plasma emission intensity. The attribute of the periodic signal that is generated by the time division multiplex process is processed using a peak-hold and decay algorithm. The peak-hold and decay algorithm can use a linear decay algorithm or a non-linear decay algorithm. In addition, further processing can be conducted on the extracted amplitude detection signal, including digital signal processing that is filtered using an infinite impulse response filter or a finite impulse response filter. The time division multiplex process is discontinued when endpoint is reached at a time that is based on the processing step.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

FIG. 24 is a graph of Corrected Plasma Emission Intensity versus Time showing the peak-hold with decay signal before and after the FIR filter was applied; and FIG. 25 is a graph of Corrected Plasma Emission Intensity versus Time showing the initial corrected emission input data with the filtered peak hold decay endpoint trace.

Similar reference characters refer to similar parts throughout the several views of the drawings.

DETAILED DESCRIPTION OF THE INVENTION

We disclose a means of detecting the transition between different materials in a time division multiplexed (TDM) process by analyzing the intensity of at least one wavelength region of the plasma emission without the use of a synchronizing trigger.

Due to the periodic and repeating nature of a TDM process, by design, the process has a number of characteristic frequencies associated with it. As an example, consider a two step TDM silicon etch process consisting of a five second etch step and a five second deposition step that are subsequently repeated a number of times (see Table 1 below). One characteristic frequency will be 0.1 Hz, determined by the total cycle time (10 seconds).

TABLE 1

| Process Parameter | Unit of Measure | Deposition | Etch |
|---|---|---|---|
| $SF_6$ Flow | sccm | 0.5 | 100 |
| $C_4F_8$ Flow | sccm | 70 | 0.5 |
| Ar Flow | sccm | 40 | 40 |
| Pressure | mTorr | 22 | 23 |
| RF Bias Power | W | 1 | 12 |
| ICP Power | W | 1000 | 1000 |
| Step Time | seconds | 5 | 5 |

Note the deposition and etch steps differ in chemistry, RF bias power and pressure resulting in significantly different emission spectra.

Figure 5:
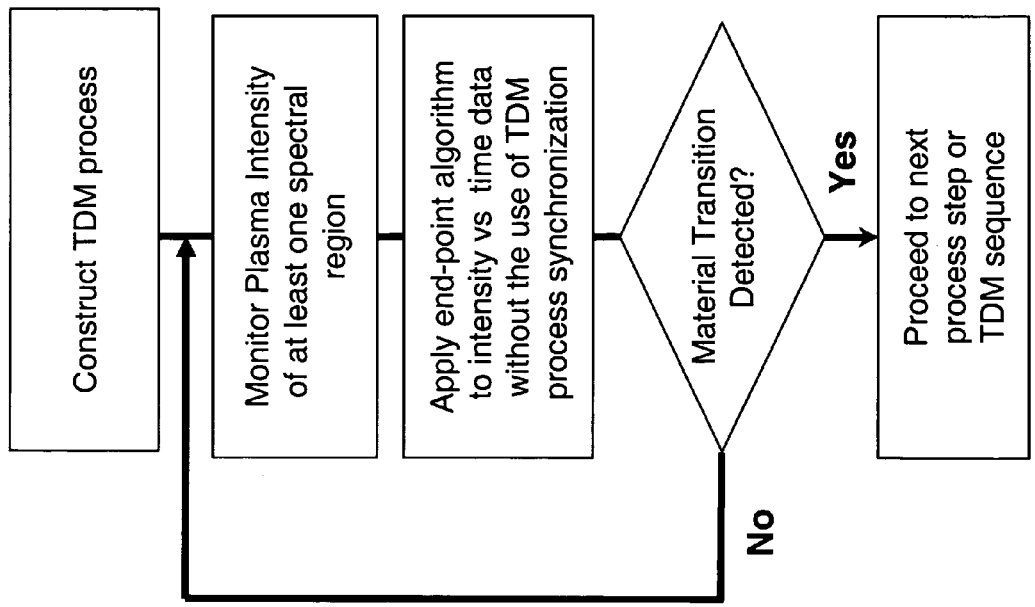
FIG. 5 is a block diagram of the improved OES technique for TDM processes.

The block diagram of FIG. 5 shows an overview of the improved OES technique for TDM processes. A TDM process is constructed as is well known in the art. At least one region of the plasma emission spectrum (typically within 200–1100 nm for plasma emission) of the TDM process is identified for process endpoint detection. The spectral region(s) is monitored over time during the course of the TDM etch process. The raw emission signal from a TDM process is periodic in nature.

There are a number of ways to detect a material transition in a TDM process without synchronizing the endpoint detection algorithm to the TDM process. These methods include an envelope follower algorithm, and a peak-hold and decay algorithm as well as applying signal processing filters.

The envelope follower technique can be used to extract amplitude information from complex waveforms. The envelope follower algorithm consists of two or more peak-hold routines operating in parallel that are sequentially reset in a round-robin fashion.

A second technique consists of a peak-hold algorithm in conjunction with a decay algorithm. The peak-hold algorithm is applied to the input data. The input data value is compared to the peak-hold value. If the input value is less than the held peak value, the peak value is allowed to decrease over time following a user defined function. The decay function can be either linear or non-linear. Once the input value is greater than the decayed hold value, the peak value is updated to the input value, and the decay algorithm restarted. As a result, the algorithm resets itself anytime the input data value exceeds the held value, thereby, avoiding the requirement of synchronizing the algorithm to the TDM process.

An alternate embodiment of the invention filters the raw data prior to applying the endpoint detection algorithm. Examples of filtering include, but are not limited to, finite impulse response (FIR) and infinite impulse response (IIR) filters.

Similarly, once the signal has been processed through the endpoint detection algorithm, the resulting endpoint trace can be filtered to improve the signal to noise characteristics of the final signal. Again, FIR, IIR and other filters may be applied.

Note, the approach is not limited to a two step cyclical process. In practice it is common to further subdivide the etch portion of the process into a number of sub-steps.

It is also important to note that the process parameters within each repetitive loop are not required to remain constant cycle to cycle. For example, it is common during the TDM etching of silicon to gradually decrease the efficiency of the deposition step over the course of the process to maintain profile control (known in the art as process morphing). In a morphed process, small parameter changes are made between some number of etch or deposition steps including, but not limited to, RF bias power, process pressure, ICP power, etc. These changes can also include changing the duration time of the process steps within a TDM cycle.

A third method to determine a material transition in a TDM process is to filter the data using an FIR, IIR or similar filter without a peak detection algorithm. Contrary to the teachings of Litvak et al. in WO 91/18283 the filters do not need to be applied over an integral number of plasma modulation cycles in order to be effective.

While these methods were demonstrated for deep Si etching using an $SF_6/C_4F_8$ based process, the methods are valid, independent of chemistry, provided a TDM process is utilized. The methods are also useful for detecting material transitions in other materials such as, dielectric materials and metals, where repetitive TDM processes are used.

Silicon Etching Example

A TDM recipe was used to etch a silicon on insulator (SOI) wafer. The recipe is listed in Table 2 below. The example below applies the invention to a 3-step TDM Si etch process.

TABLE 2

| Process Parameter | Unit of Measure | Deposition | Etch A | Etch B |
| --- | --- | --- | --- | --- |
| $SF_6$ Flow | sccm | 1 | 50 | 100 |
| $C_4F_8$ Flow | sccm | 70 | 1 | 1 |
| Ar Flow | sccm | 40 | 40 | 40 |
| Pressure | mTorr | 22 | 23 | 23 |
| RF Bias Power | W | 1 | 12 | 12 |
| ICP Power | W | 1500 | 1500 | 1500 |
| Step Time | seconds | 6 | 3 | 7 |

The experiments were performed on a commercially available Unaxis Shuttlelock series Deep Silicon Etch (DSE) tool. Emission spectra were collected at a frequency of 1 Hz using a commercially available Unaxis Spectraworks emission spectrometer.

Figure 1:
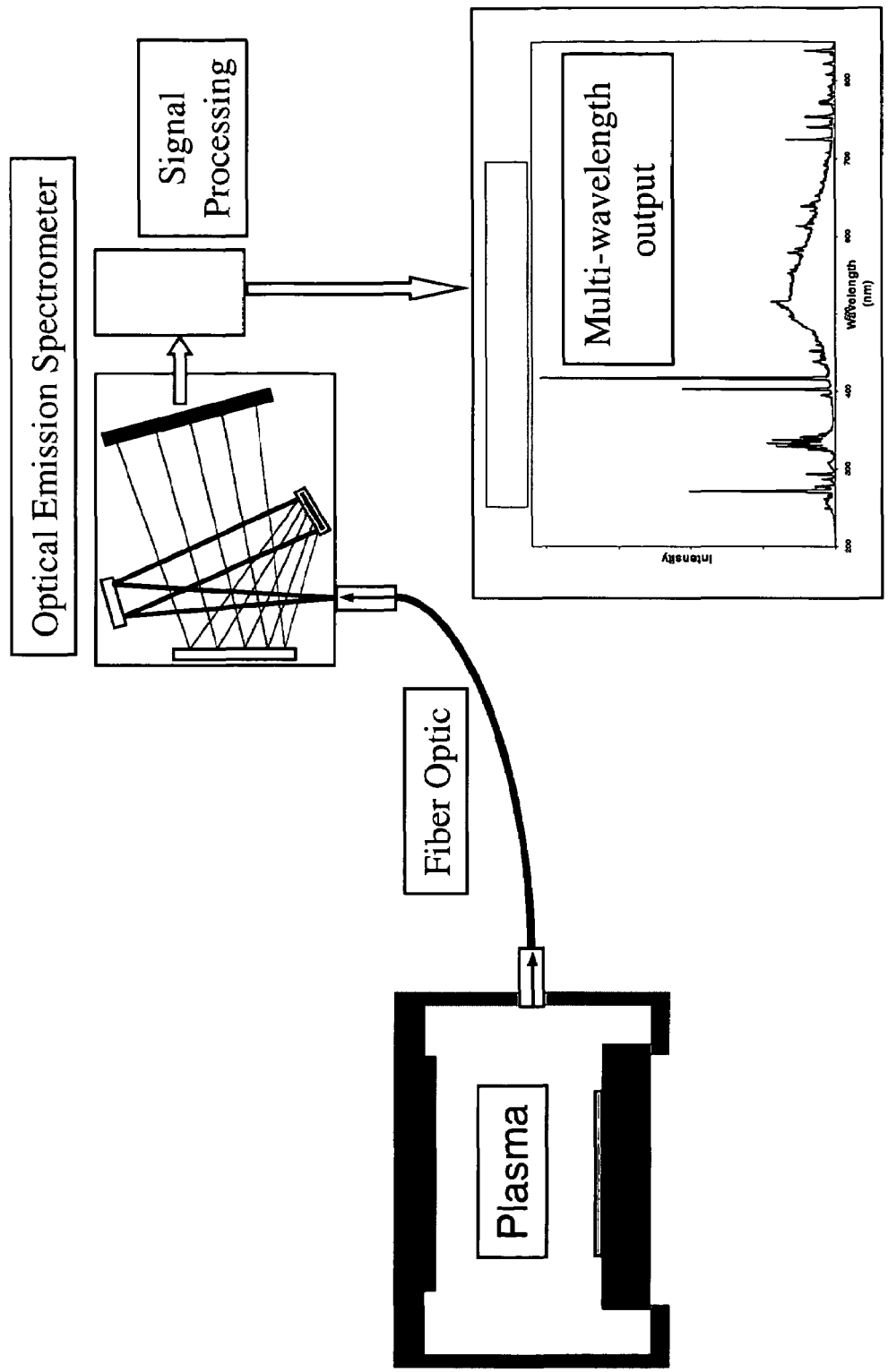
FIG. 1 is a schematic view of a typical optical emission spectroscopy configuration.
Figure 2:
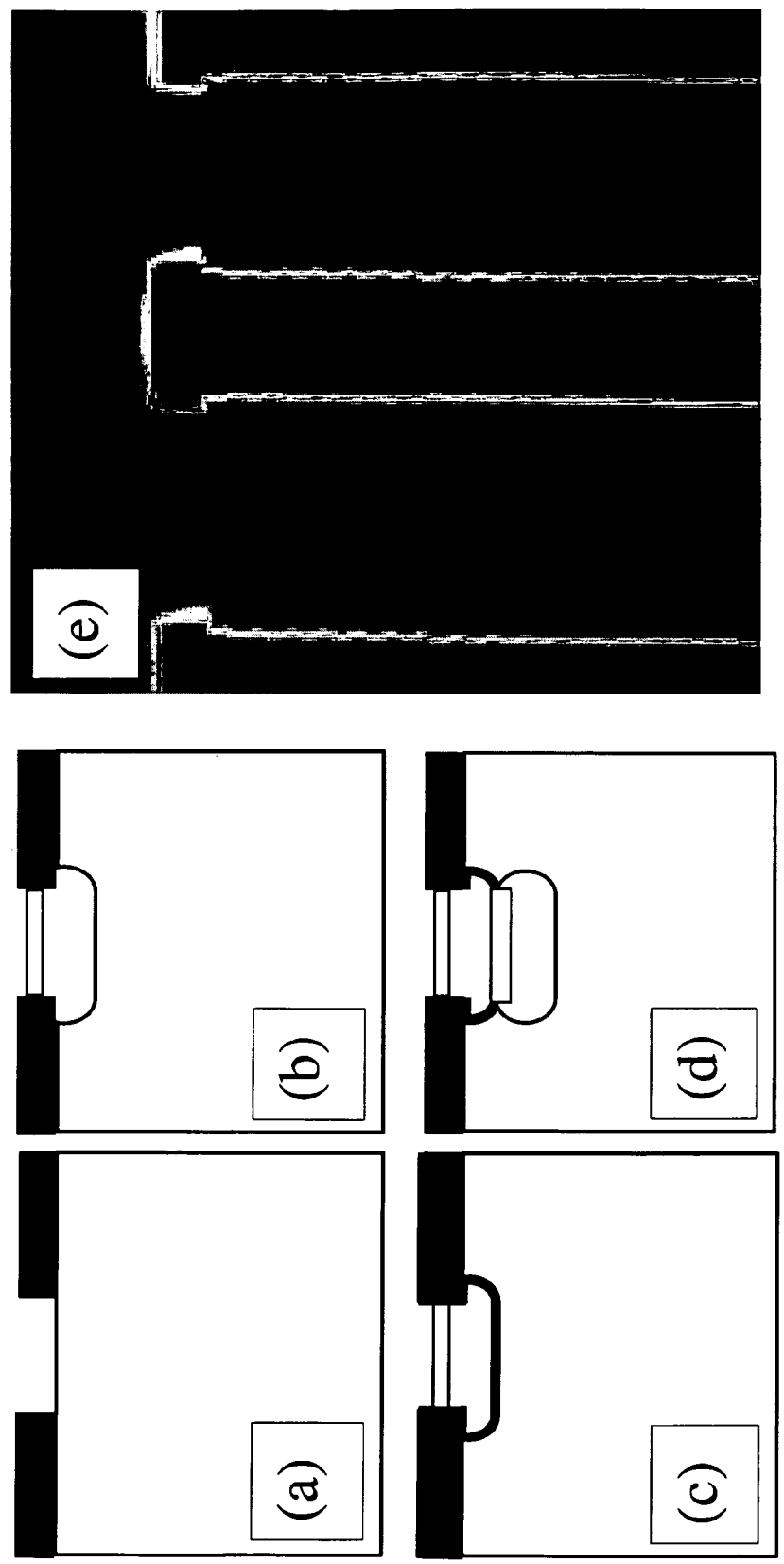
FIG. 2 is a pictorial example of one type of the TDM process for deep silicon etching.
Figure 3:
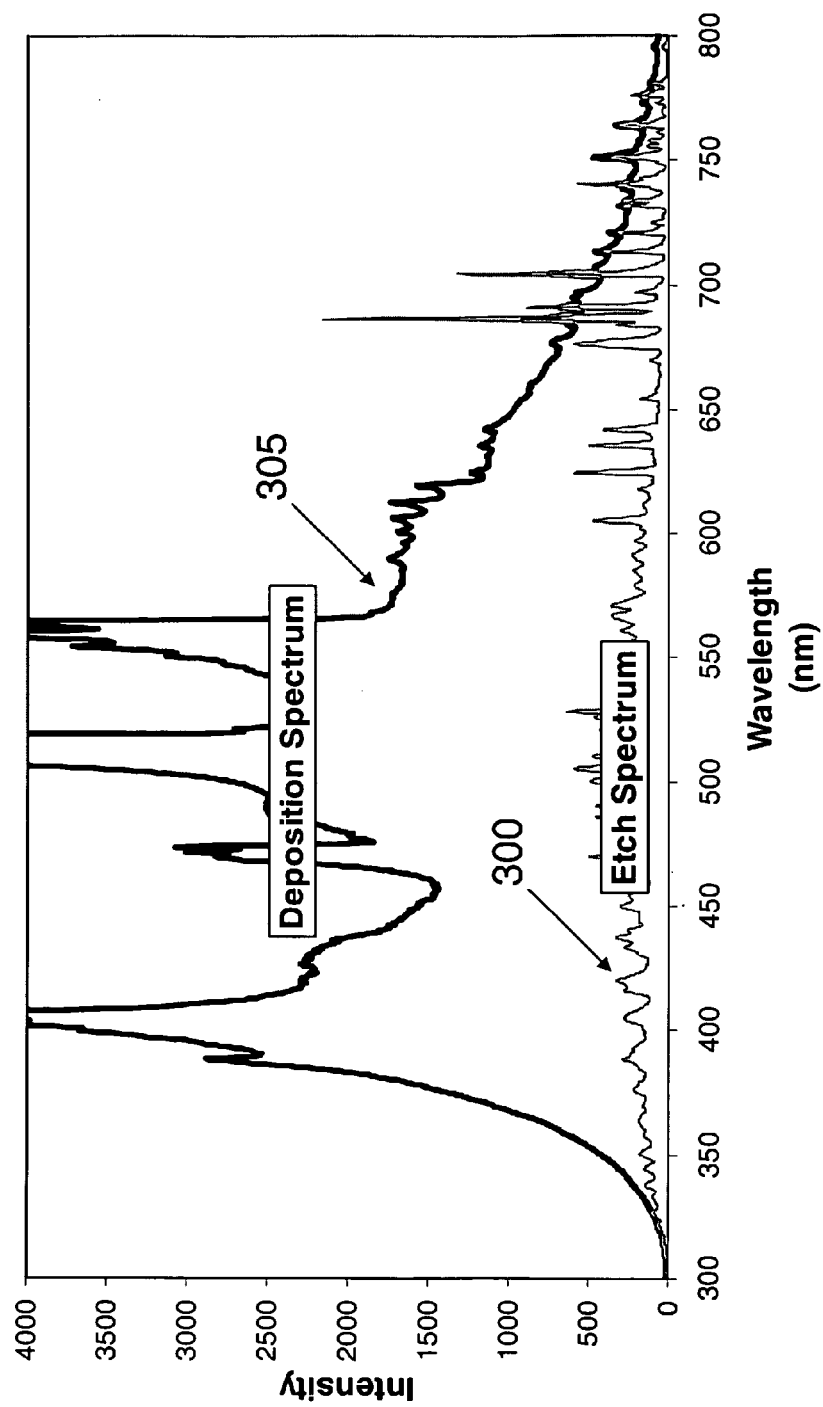
FIG. 3 is a graph of the intensity versus wavelength for Deposition and Etch Plasma Emission Spectra for a deep silicon etch process.
Figure 4:
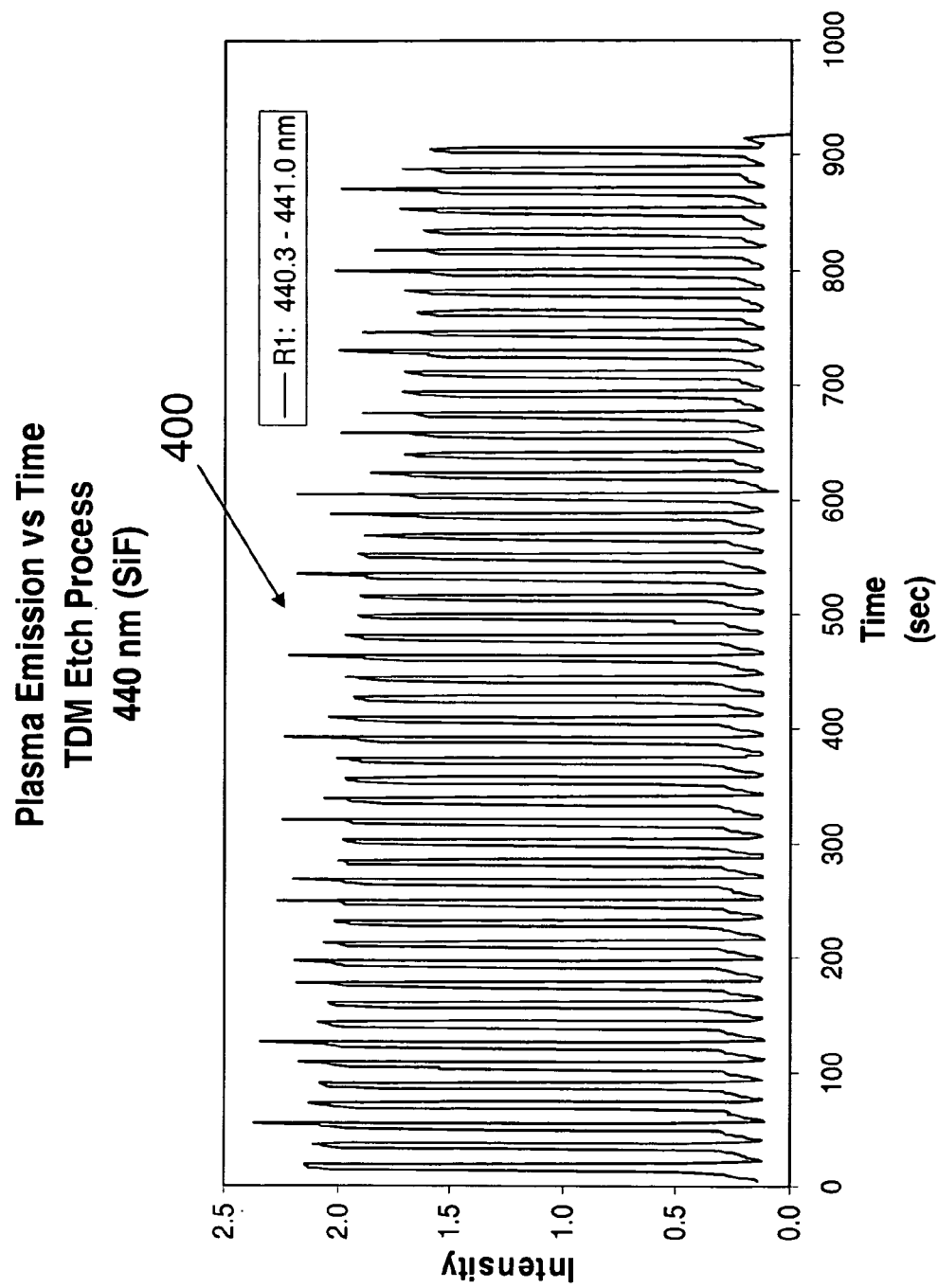
FIG. 4 is a graph of the Plasma Emission Intensity versus Time for a typical deep silicon etch process focusing on the emission spectra around the 440 nm peak.
Figure 6:
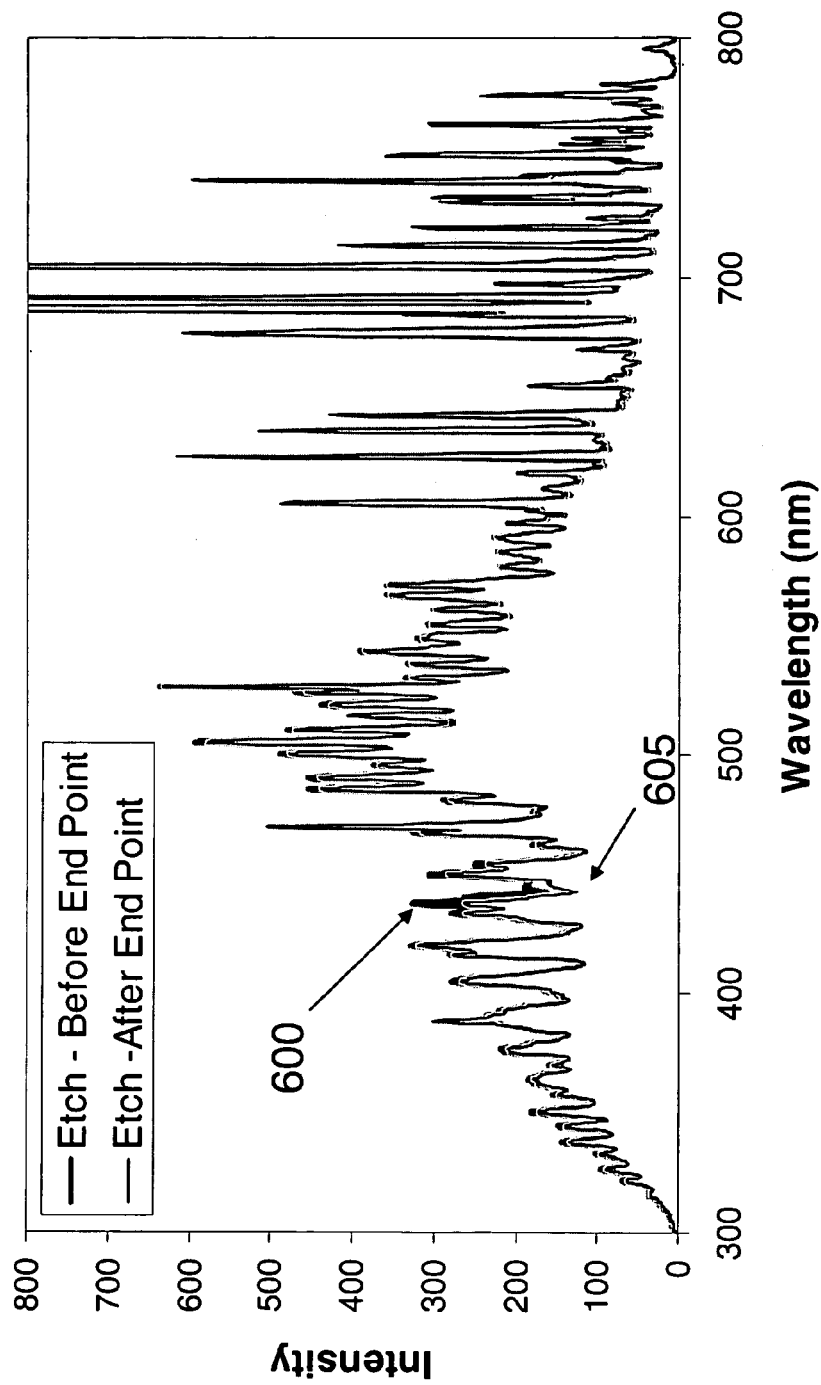
FIG. 6 is a graph of the Plasma Emission Intensity versus wavelength for a deep silicon etch process focusing on the emission spectra from the Etch B step before and after the silicon has cleared.
Figure 7:
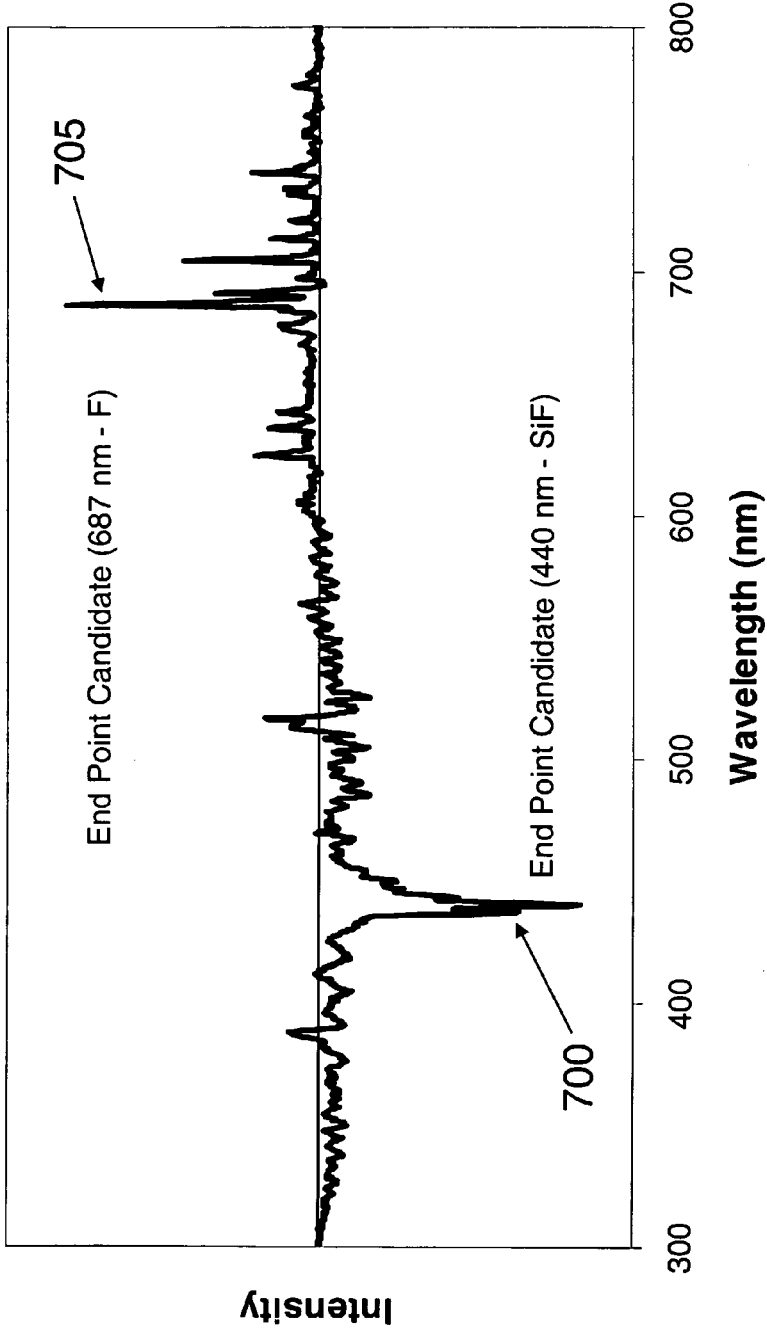
FIG. 7 is a graph of the Difference (Post etch-Pre etch) Plasma Emission Intensity versus wavelength for a deep silicon etch process to determine endpoint candidates.

In order to determine the spectral regions of interest, a test wafer was etched and plasma emission spectra in both the Deposition and Etch B were analyzed prior to and after the silicon layer had been cleared (process endpoint). Since little etching is expected during the deposition phases of the process, FIG. 6 focuses on the emission spectra from the Etch B step before 600 and after 605 the silicon has cleared. Note the slight difference in etch spectra near 450 nm. In order to determine endpoint candidates, a difference spectrum was constructed point-by-point. The resultant spectrum is shown in FIG. 7. Candidates for endpoint detection occur at 440 nm (700) and 686 nm (705). The 440 nm peak is assignable to SiF emission (etch product—decreases as the Si is cleared) while the 686 nm peak is assignable to F emission (reactant—increases as the Si is cleared). As shown previously in FIG. 4, a plot of the value within the 440 nm region versus time shows only a slight decrease in the peak-to-peak values of the oscillating signal as the etch proceeds, and it is difficult to determine a process endpoint.

Figure 8:
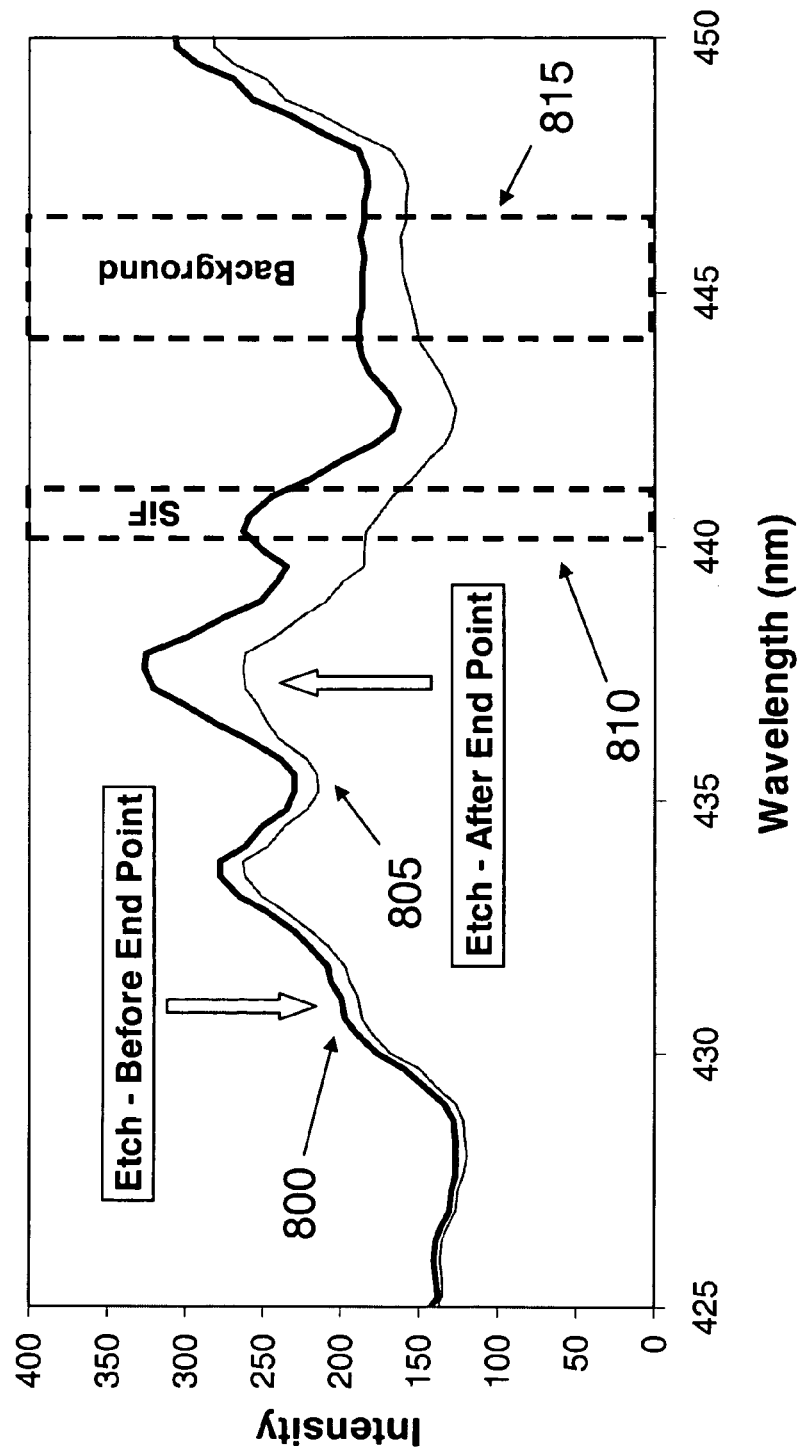
FIG. 8 is a graph of the Plasma Emission Intensity versus wavelength around the 440 nm region for the etch portion of a deep silicon etch process.

An improved endpoint strategy was constructed based on the 440 nm emission peak. FIG. 8 shows a magnified view of the pre-endpoint 800 and post-end point 805 Etch B emission spectra in order to more closely examine the 440 nm peak. In order to reduce correlated noise, two spectral regions were monitored, i.e., a narrow 440 nm peak 810 (SiF emission) and a broader spectral region centered around 445 nm 815 for background correction.

Figure 9:
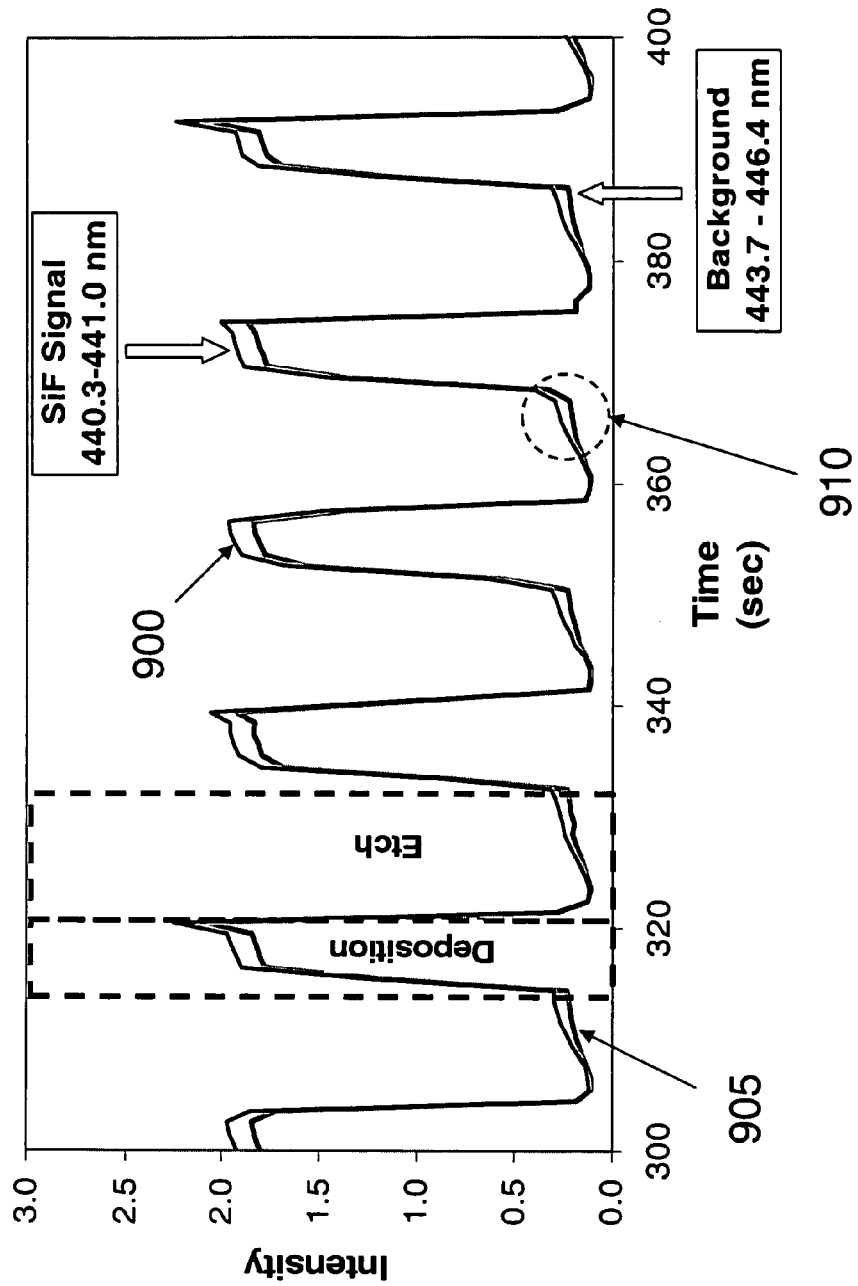
FIG. 9 is a graph of Plasma Emission Intensity versus Time focusing on the Signal (440 nm) and Background (445 nm) for a deep silicon etch process.
Figure 10:
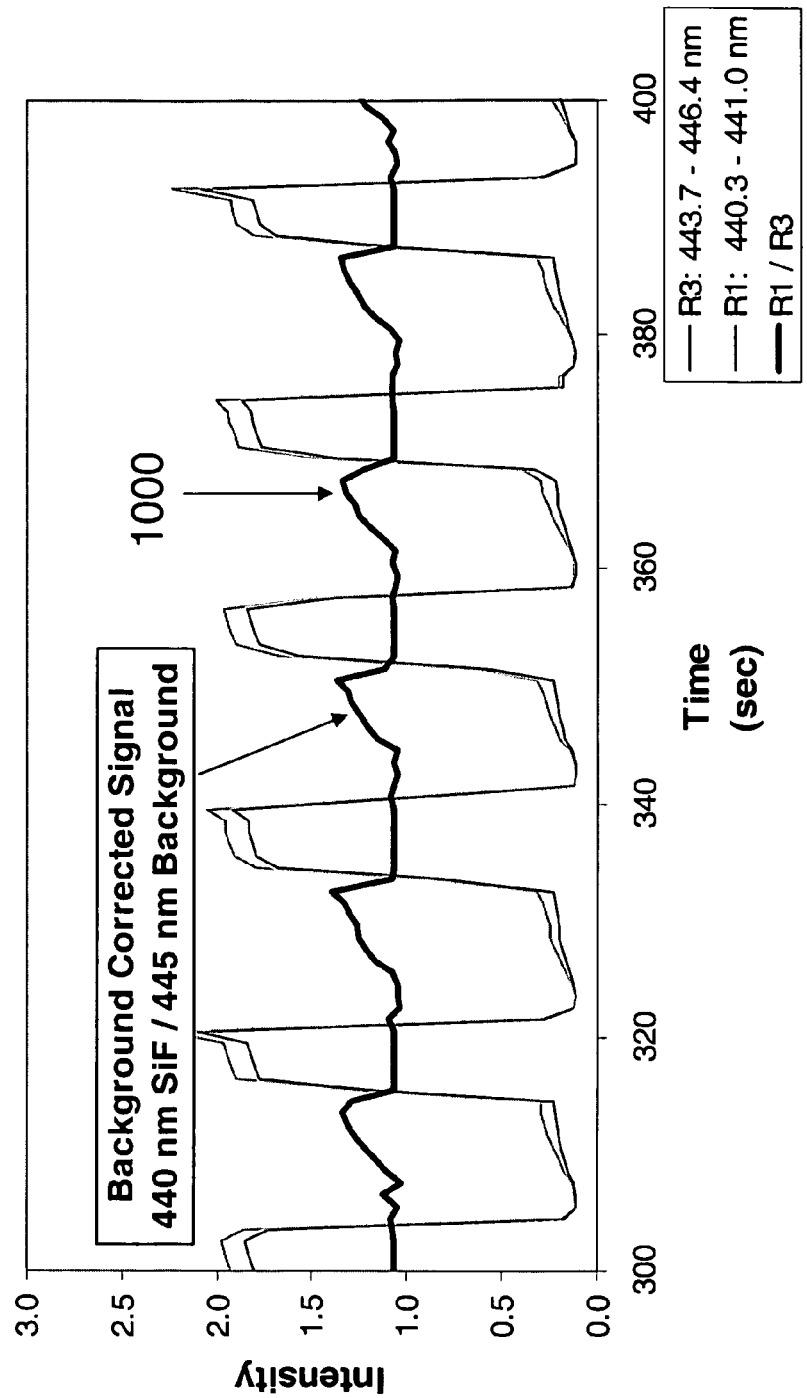
FIG. 10 is a graph of Plasma Emission Intensity versus Time focusing on the Signal (440 nm) and Background (445 nm) for a deep silicon etch process and showing the ratio of the 440 nm signal to the 445 nm background.

FIG. 9 shows a magnified view of the emission intensities at 440 nm and 445 nm over the range of 300 to 400 seconds of total etch time. Note, the signal 900 (440 nm) and background 905 (445 nm) regions track each other well (equal or parallel) during the higher intensity deposition step, but diverge near the end of the Etch B step 910. Constructing the ratio of the 440 nm signal (designated R1) to the 445 nm background (designated R3) results in the data shown in FIG. 10. Note the periodic and repeating nature of the ratio signal 1000.

Figure 11:
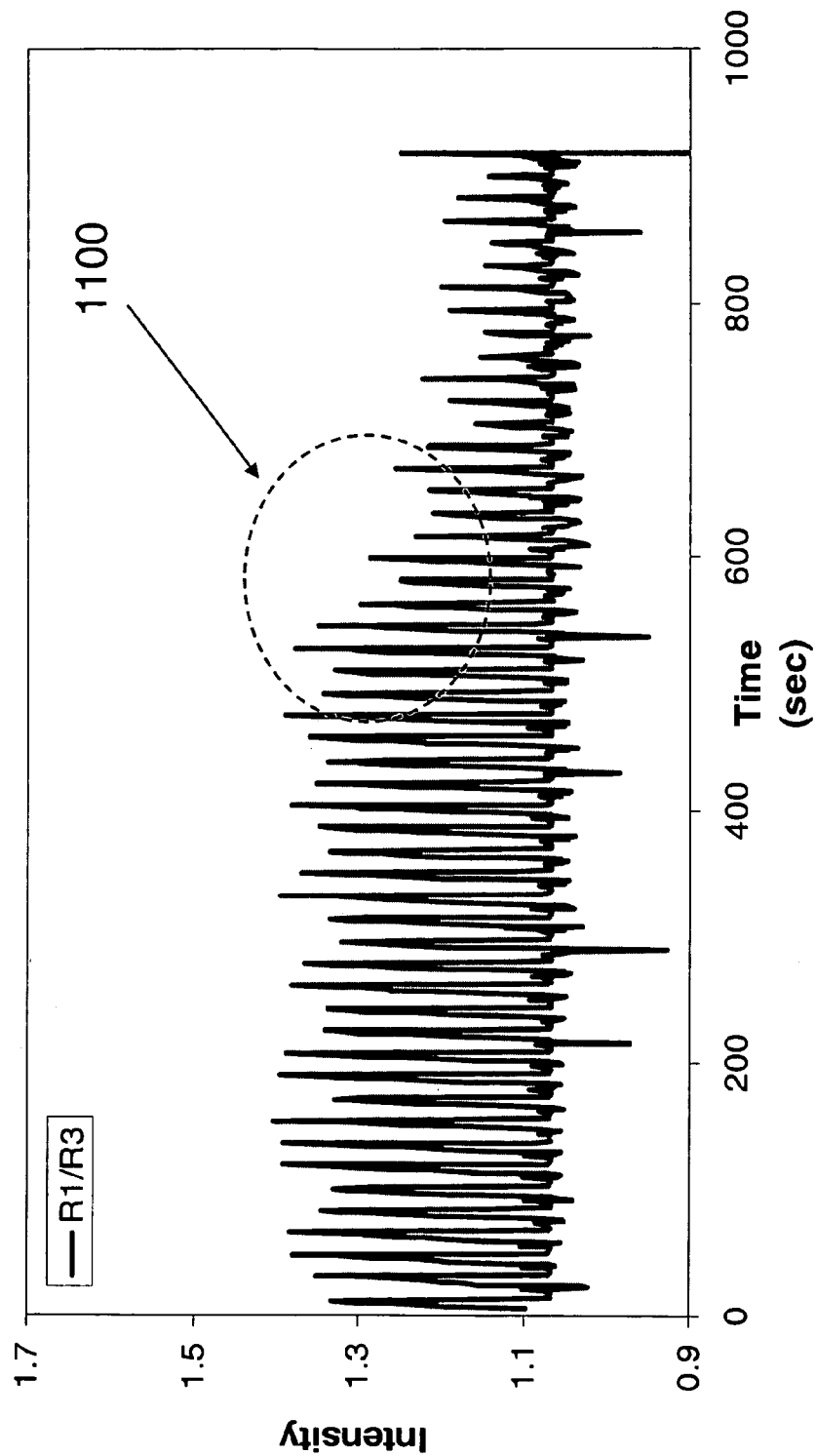
FIG. 11 is a graph of the Corrected Plasma Emission Intensity versus Time obtained from the ratio of the 440 nm signal to the 445 nm background over the course of the etch.

FIG. 11 shows the background corrected signal (ratio of 440 nm SiF/445 nm background) over the course of the etch. Note the marked decrease in successive peak heights 1100 near 600 seconds.

Figure 12:
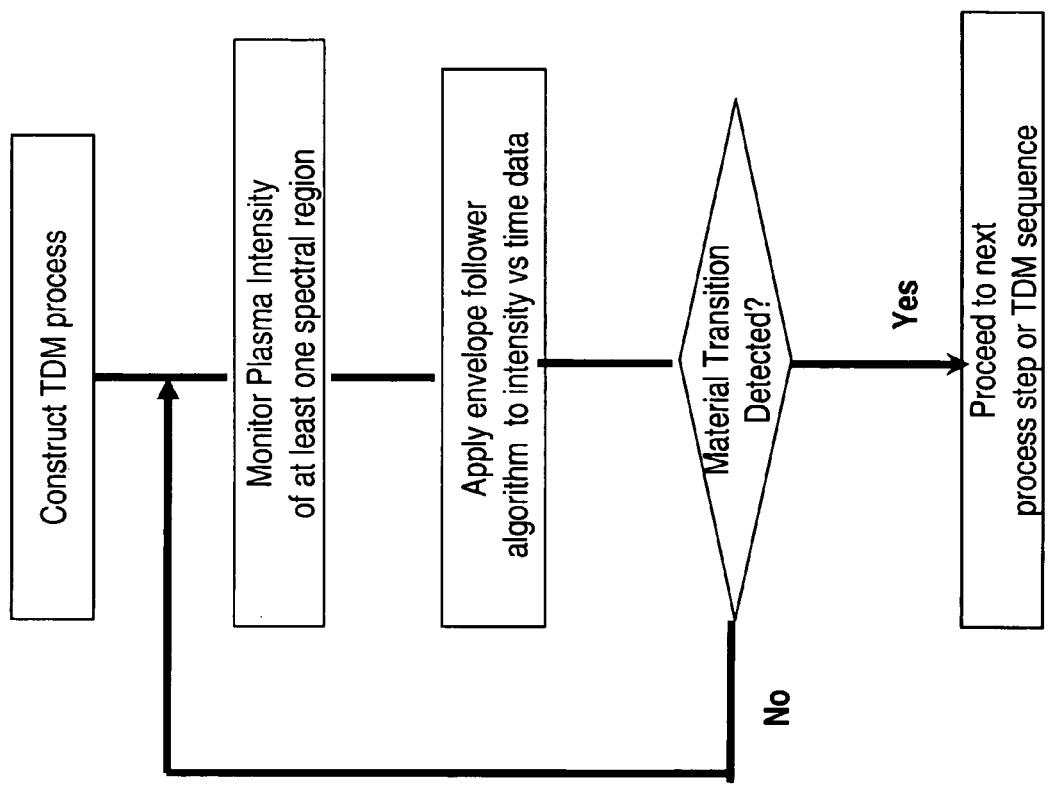
FIG. 12 is a flowchart for the envelope follower TDM endpoint algorithm.
Figure 13:
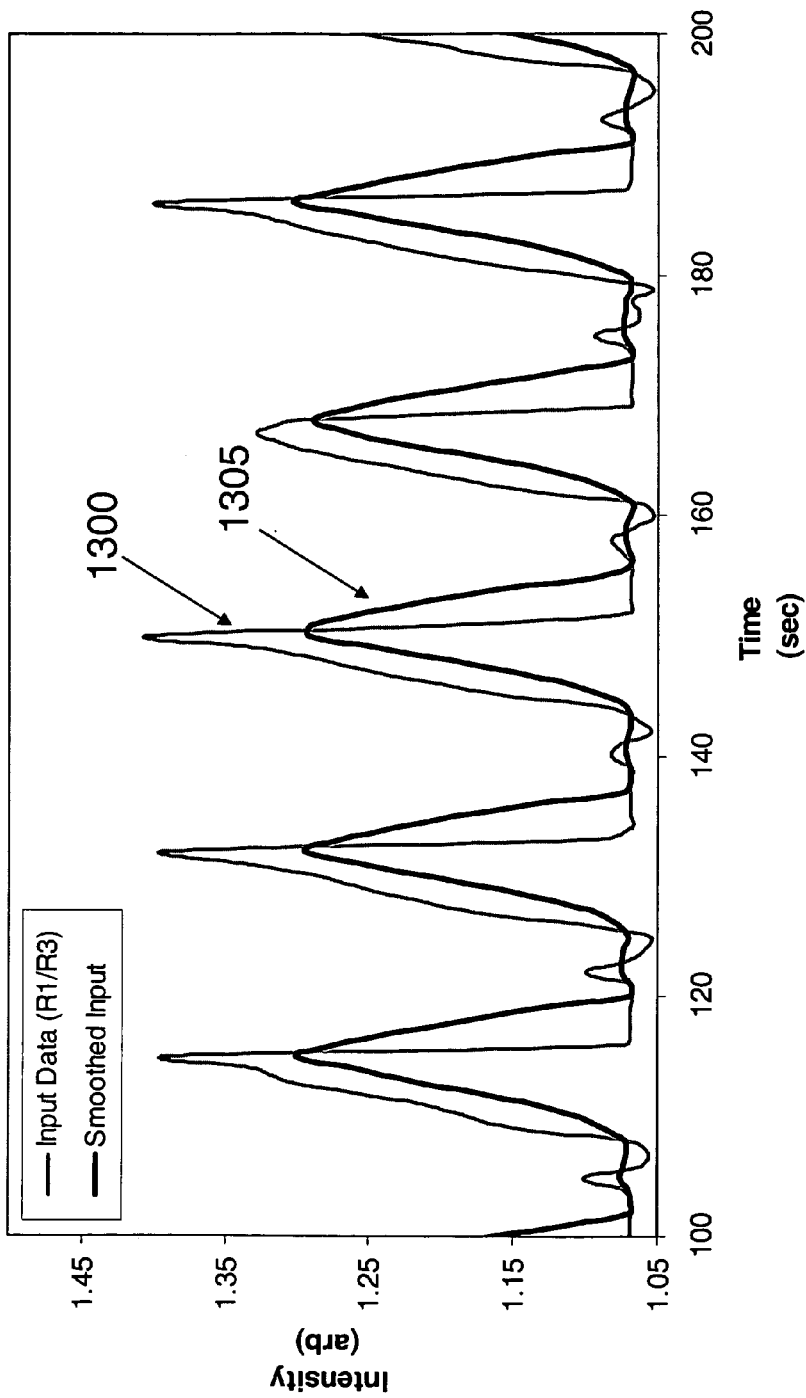
FIG. 13 is a graph of the Corrected Plasma Emission Intensity versus Time for a deep silicon etch process using the data from FIG. 11 after a finite response filter has been applied.

FIG. 12 shows a flowchart for the envelope follower TDM endpoint algorithm. Once the data has been acquired, it can be filtered prior to applying the envelope follower. FIG. 13 shows the data 1300 from FIG. 11 after a finite response filter (5 point moving average) has been applied 1305.

Figure 14:
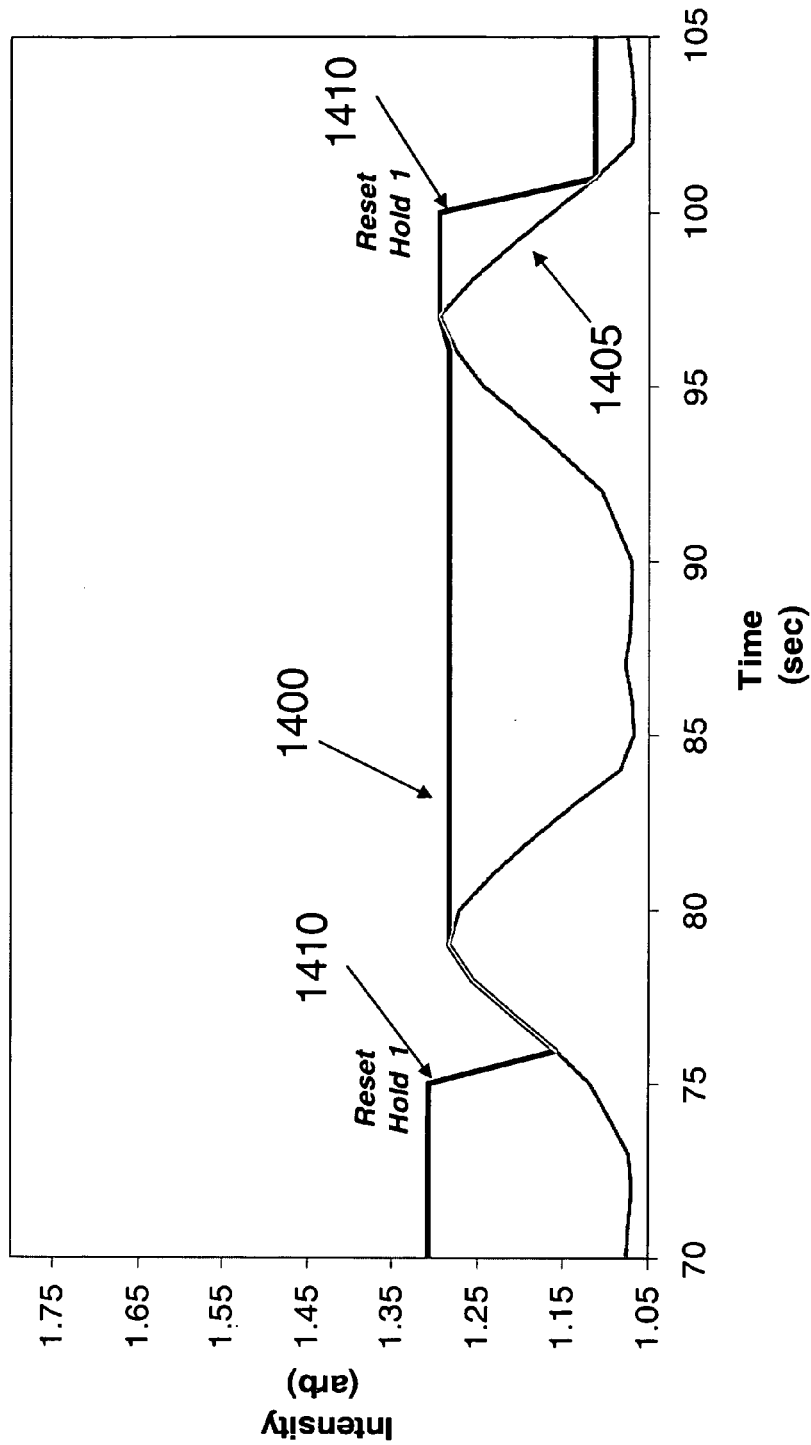
FIG. 14 is a graph of Corrected Plasma Emission Intensity versus Time using an envelope follower algorithm with peak-hold and reset applied to the filtered input data of FIG. 13.
Figure 15:
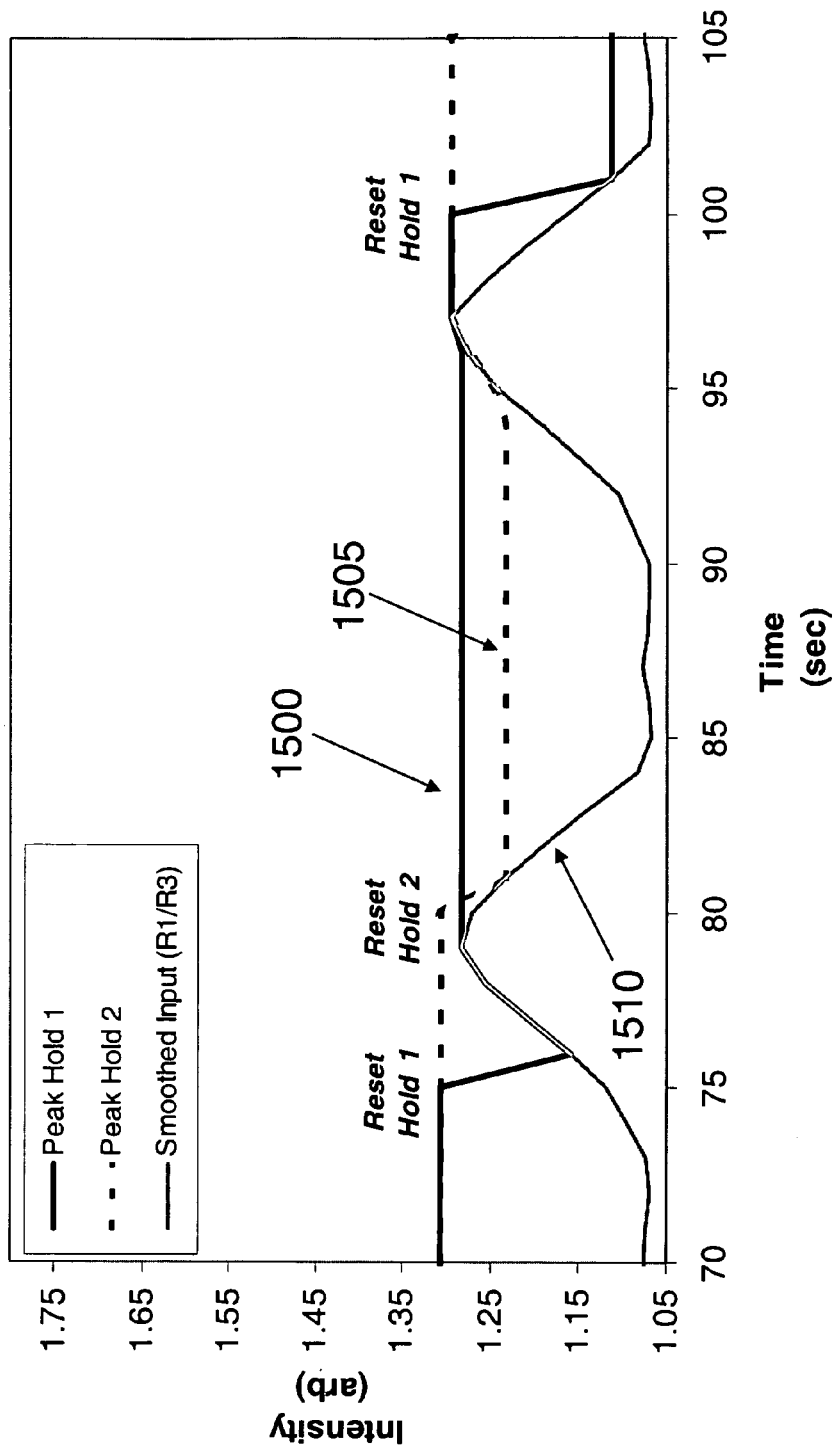
FIG. 15 is a graph of Corrected Plasma Emission Intensity versus Time using an envelope follower algorithm with multiple peak-holds and sequential resets applied to the filtered input data of FIG. 13.

FIGS. 14 and 15 show the first step of the envelope follower algorithm of the present invention. FIG. 14 is a graph of a peak-hold algorithm 1400 with reset 1410 applied to the filtered input data 1405 of FIG. 13. Whereas, FIG. 15 is a graph of the envelope follower algorithm using multiple peak-holds (1500 and 1505) with sequential resets applied to the filtered input data 1510 of FIG. 13. The data for FIGS. 14 and 15 were acquired at 1 Hz.

Figure 16:
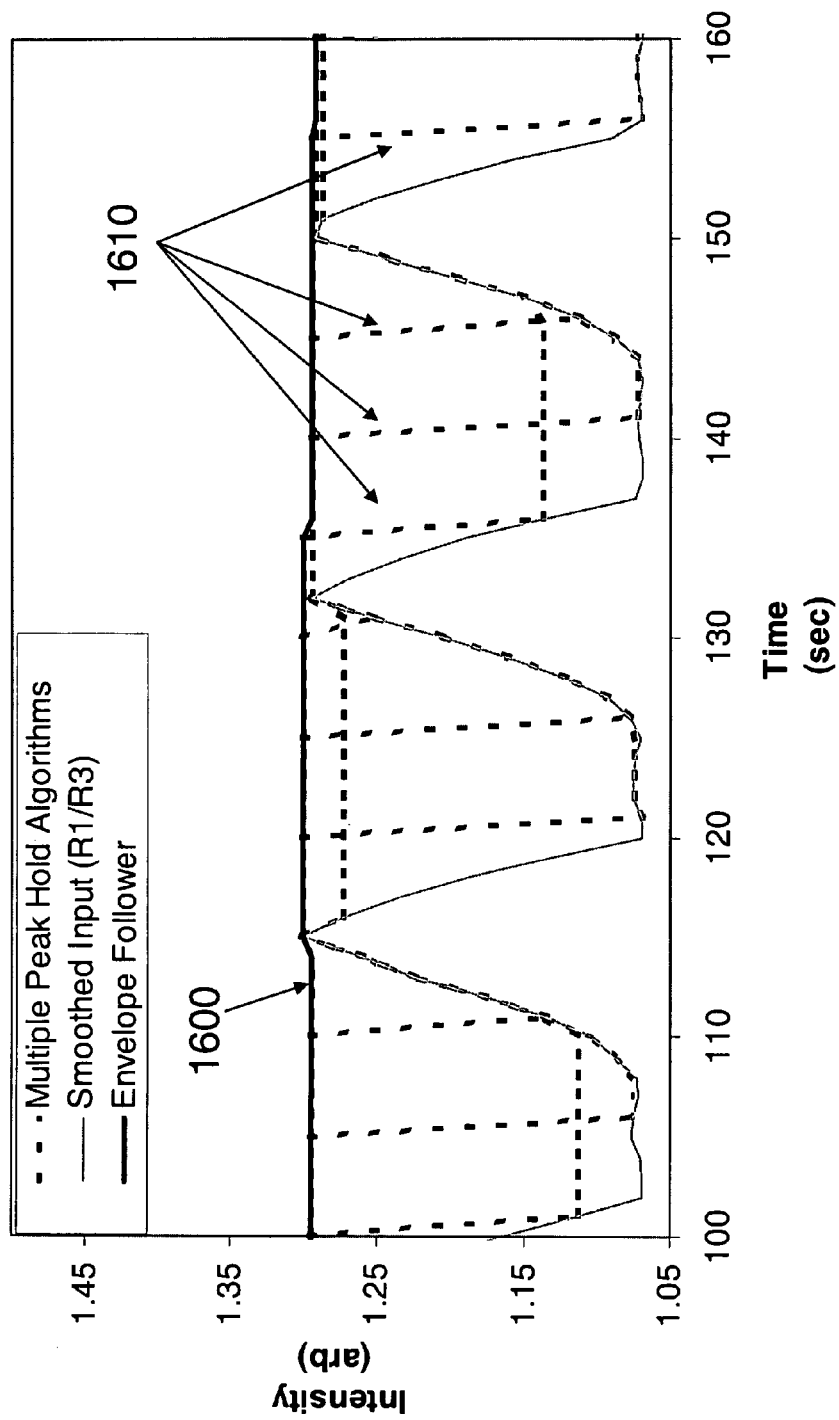
FIG. 16 is a graph of Corrected Plasma Emission Intensity versus Time using the envelope follower algorithm to determine the maximum value of the sequential peak hold circuits.
Figure 17:
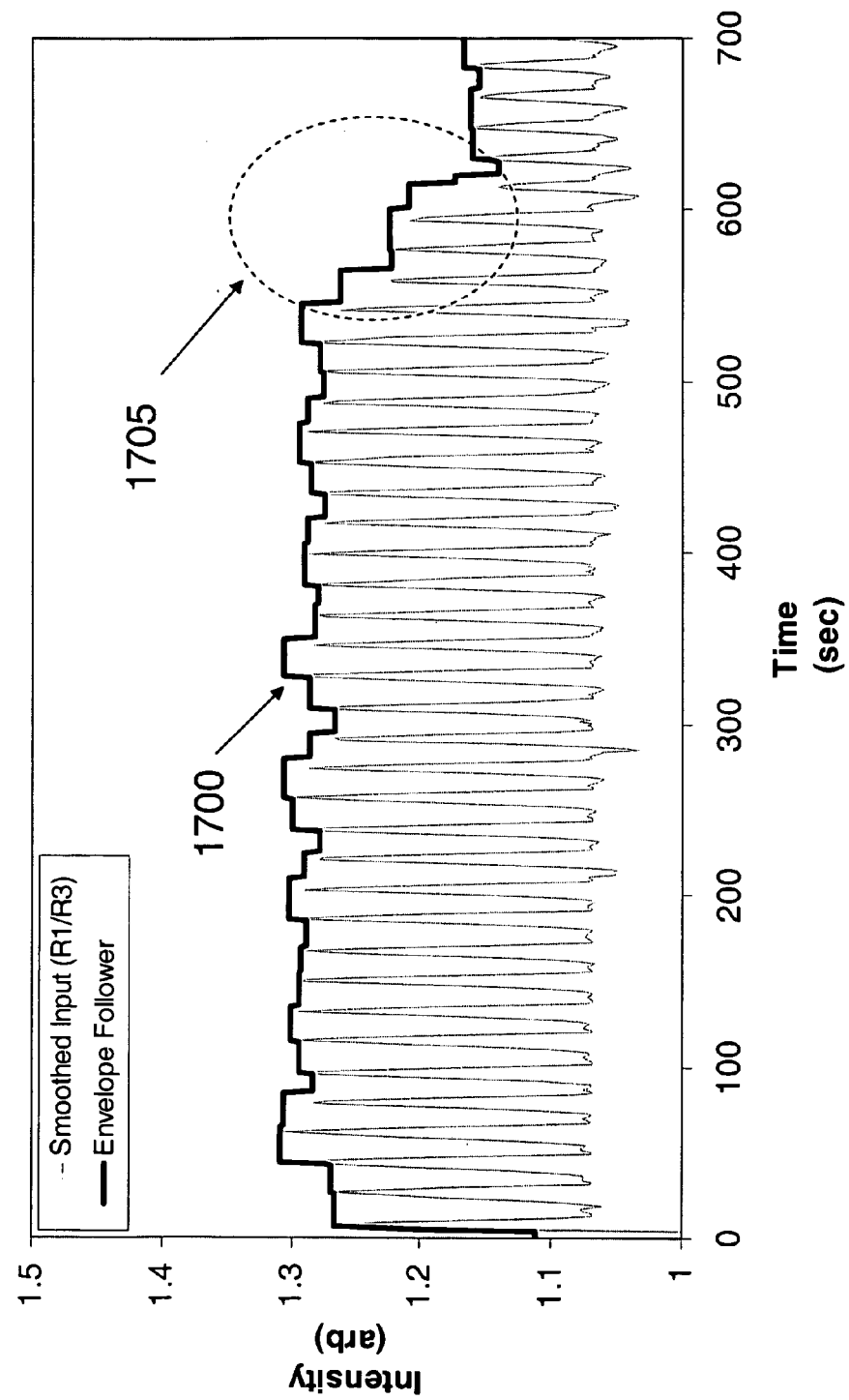
FIG. 17 is a graph of Corrected Plasma Emission Intensity versus Time using the envelope follower of the present invention applied to a TDM etch process.

The next step of the envelope follower algorithm determines the maximum value 1600 of the sequential peak hold circuits 1610 (see FIG. 16). FIG. 17 shows the resultant envelope follower 1700 for the process. Note the drop in magnitude 1705 near 550 seconds.

Figure 18:
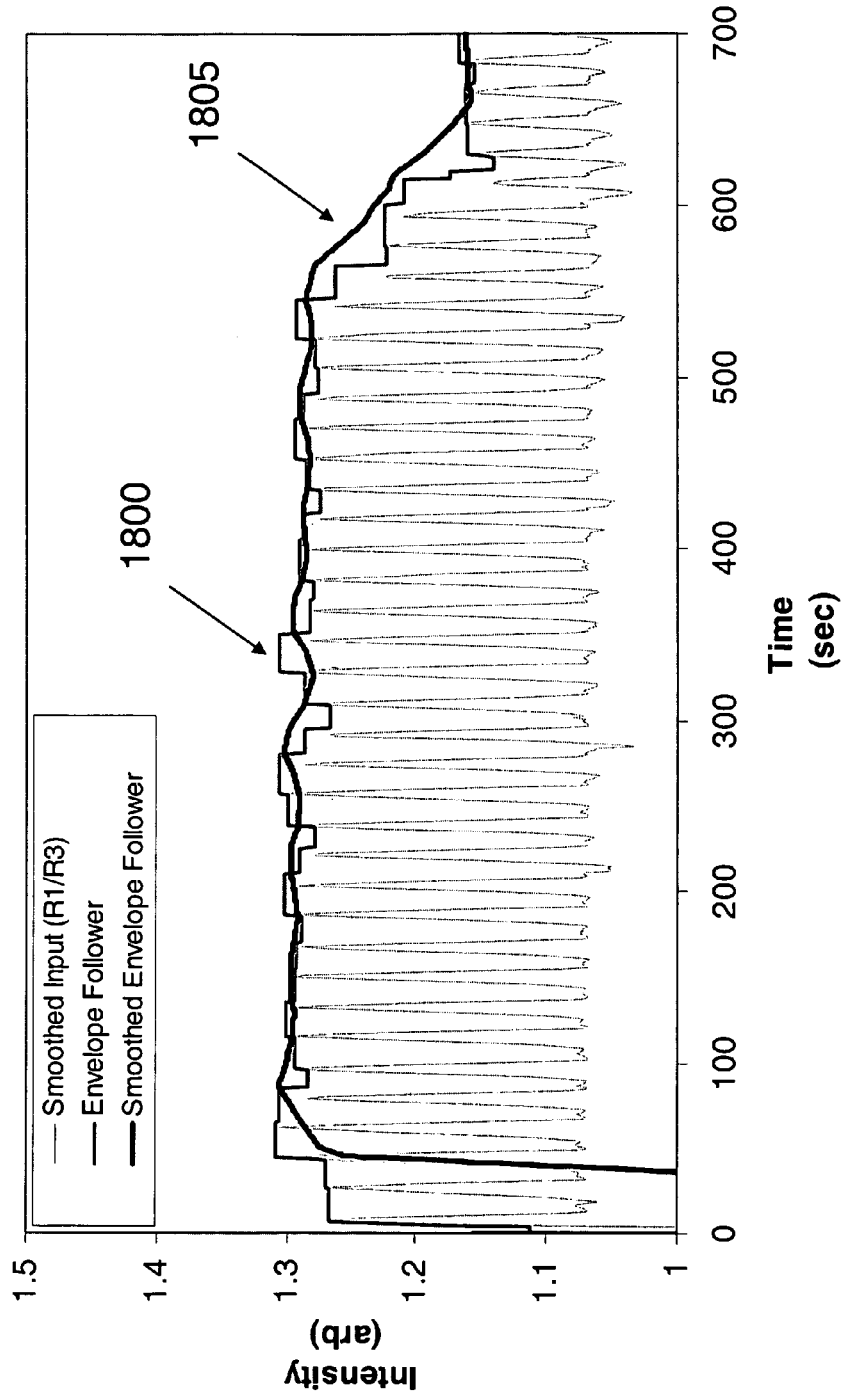
FIG. 18 is a graph of Corrected Plasma Emission Intensity versus Time using the envelope follower signal before and after an FIR filter was applied.

Once the envelope follower has been calculated, additional filtering can be applied to further increase the signal to noise ratio. FIG. 18 shows the envelope follower signal before 1800 and after 1805 an FIR filter (45 seconds moving average) was applied.

Figure 19:
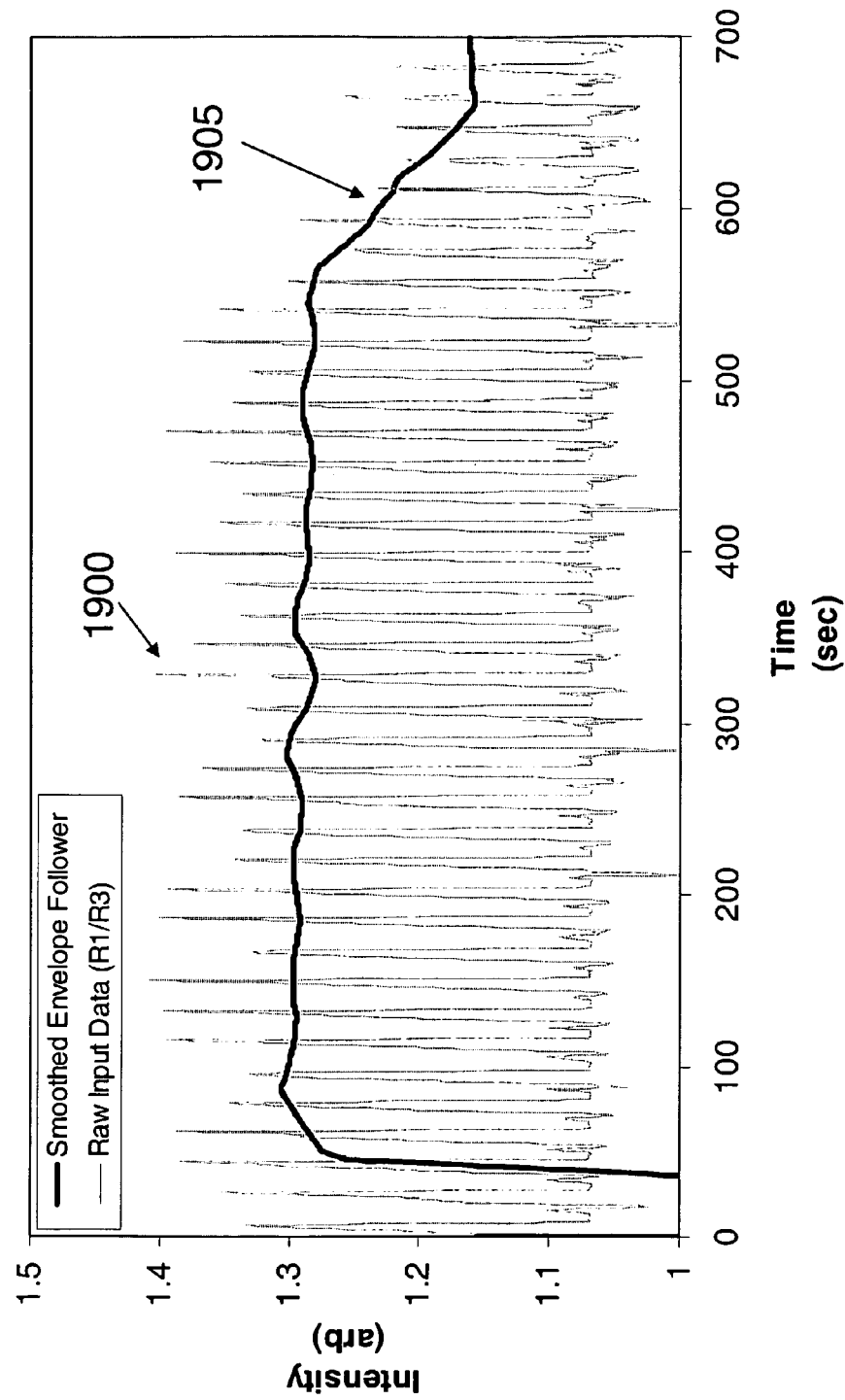
FIG. 19 is a graph of Corrected Plasma Emission Intensity versus Time showing the initial corrected emission input data with a filtered envelope follower endpoint trace.

In summary, FIG. 19 shows the initial corrected emission input data with the filtered envelope follower endpoint trace 1905.

The filtered envelope follower trace can subsequently be further processed using commonly known techniques (such as threshold crossing detection or derivative processing) to determine the time at which "endpoint" occurs.

Figure 20:
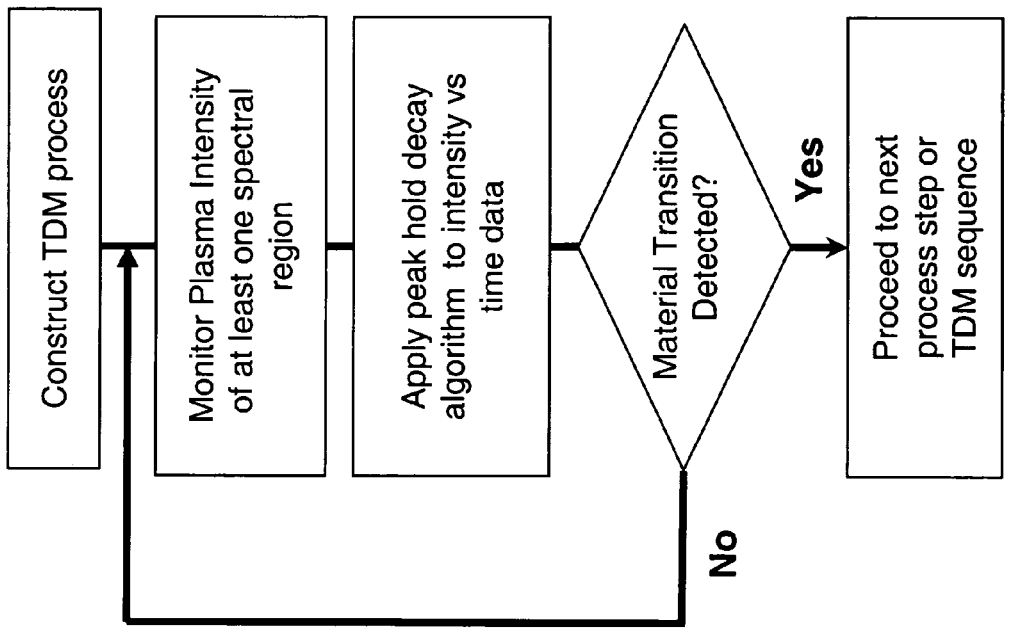
FIG. 20 is a flowchart for the peak-hold and decay TDM endpoint algorithm.

FIG. 20 shows a flowchart for the peak-hold and decay TDM endpoint algorithm. Once the data has been acquired and filtered (revisit FIG. 13 acquired at 1 Hz and filtered with a 5 point moving average) a peak-hold and decay algorithm is applied.

Figure 21:
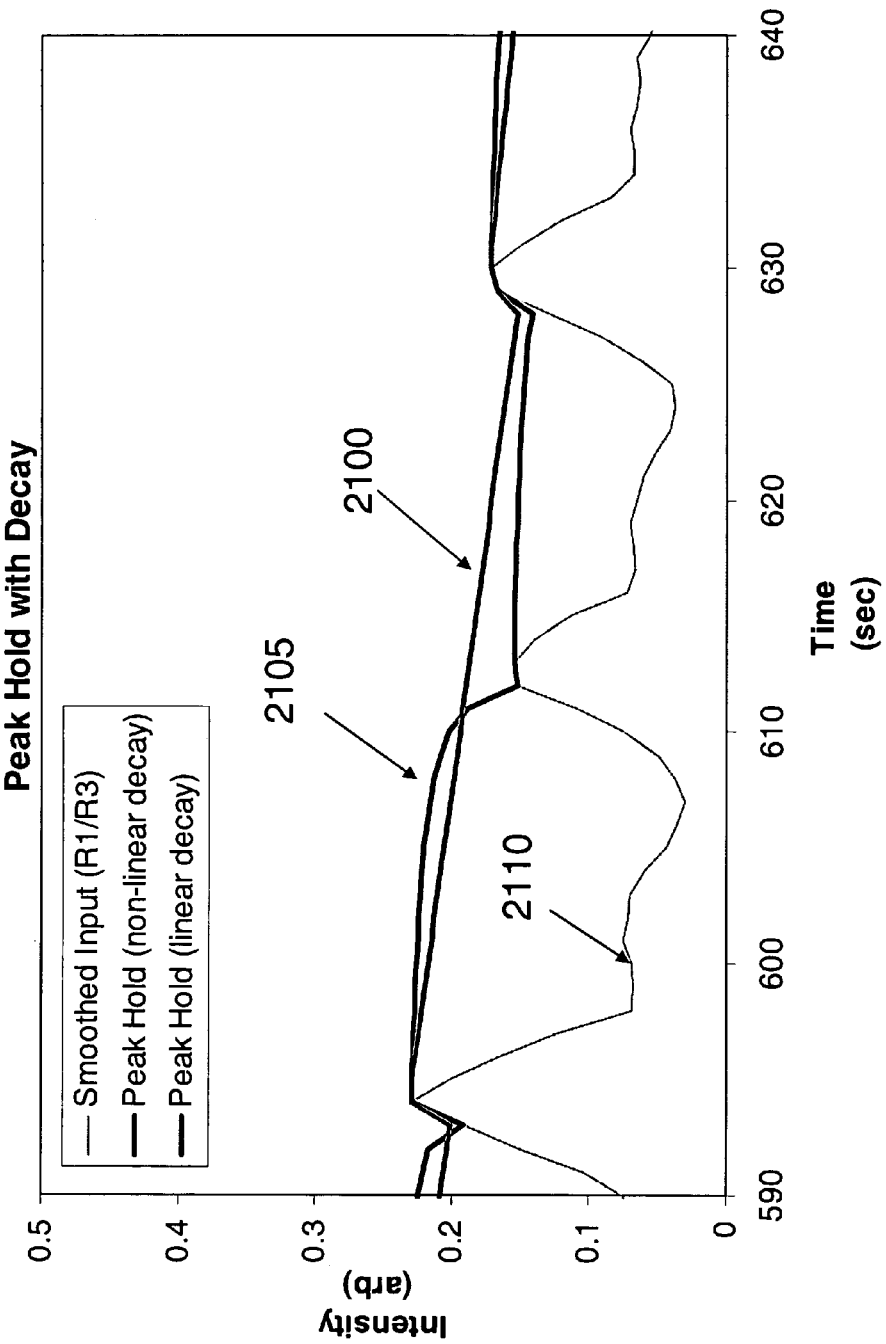
FIG. 21 is a graph of Corrected Plasma Emission Intensity versus Time showing examples of both linear and non-linear decay functions applied to the same input data.

FIG. 21 shows examples of both linear 2100 and non-linear 2105 decay functions applied to the same input data 2110.

Figure 22:
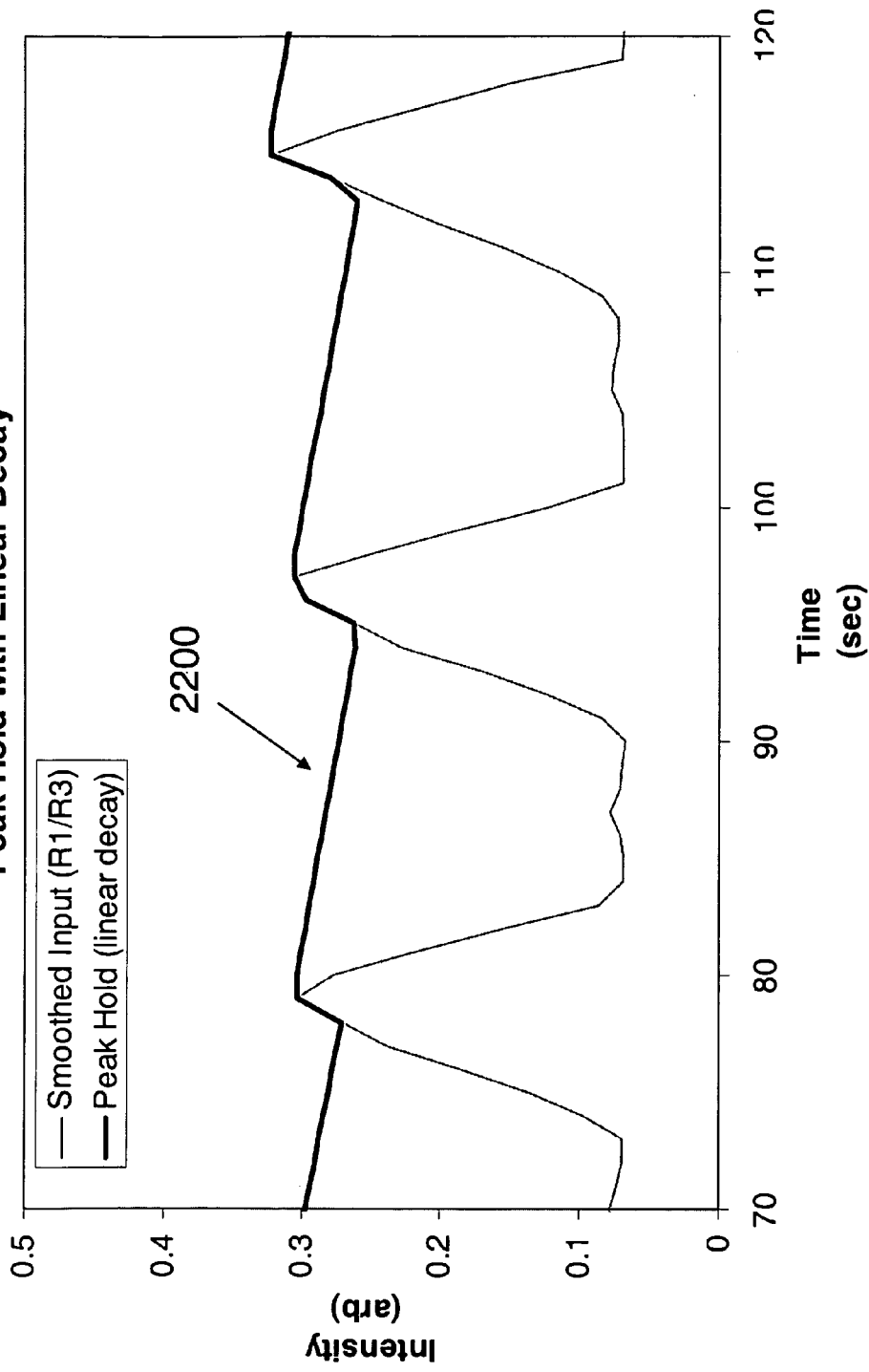
FIG. 22 is a graph of Corrected Plasma Emission Intensity versus Time showing an example of the peak hold with a linear decay.

FIG. 22 shows an example of the peak hold 2200 with a linear decay of 55 seconds (e.g., the current peak value would decay to a value of zero in 55 sample intervals). The data was acquired at 1 Hz.

Figure 23:
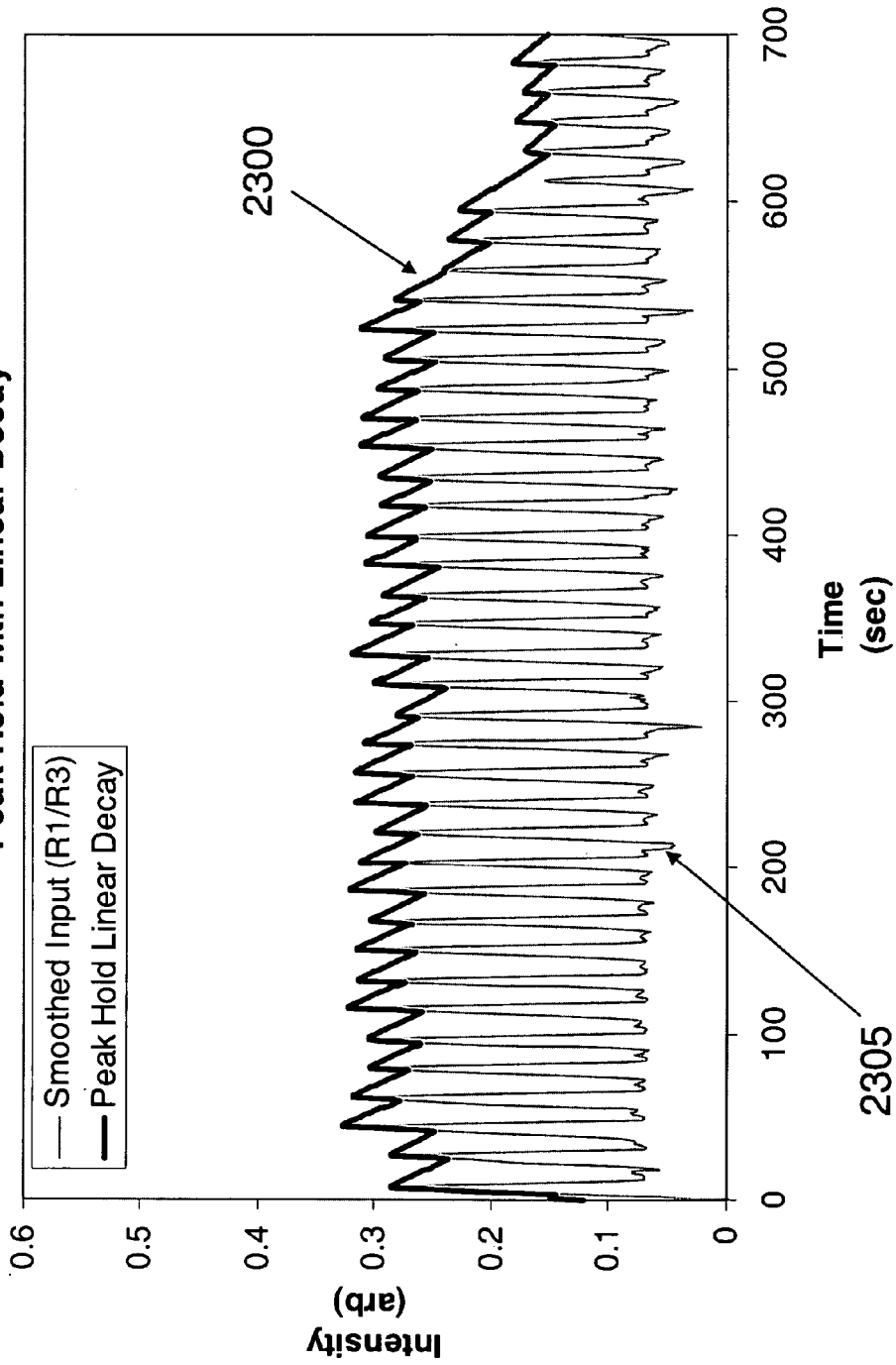
FIG. 23 is a graph of Corrected Plasma Emission Intensity versus Time showing the peak hold with linear decay applied to the filtered input data.

FIG. 23 shows the peak hold with linear decay 2300 applied to the filtered input data 2305. In order to further improve the signal to noise characteristics of the endpoint trace, a FIR filter was applied after the peak hold decay algorithm.

FIG. 24 shows the peak-hold with decay signal before 2400 and after 2405 the FIR filter (30 seconds moving average) was applied.

In summary, FIG. 25 shows the initial corrected emission input data 2500 with the filtered peak hold decay endpoint trace 2505.

The filtered peak hold decay trace can subsequently be further processed using commonly known techniques (such as threshold crossing detection or derivative processing) to determine the time at which "endpoint" occurs.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention. Now that the invention has been described,

We claim:

1. A method for etching a feature in a substrate comprising the steps of:
    subjecting the substrate to an alternating cyclical process within a plasma chamber;
    monitoring a variation in plasma emission intensity;
    extracting an amplitude information from said plasma emission intensity using an envelope follower algorithm; and
    discontinuing said alternating cyclical process at a time based on said monitoring step.

2. The method of claim 1 wherein the substrate to be etched contains silicon.

3. The method of claim 1 wherein the substrate to be etched contains a group-III element.

4. The method of claim 1 wherein the substrate to be etched contains a group-V element.

5. The method of claim 1 wherein said alternating cyclical process further comprising at least one etching step and at least one deposition step.

6. The method of claim 1 wherein said alternating cyclical process further comprising a plurality of etching steps and a plurality of deposition steps.

7. The method of claim 1 wherein at least one process parameter varies over time within said alternating cyclical process.

8. The method of claim 1 wherein said plasma emission intensity is periodic.

9. The method of claim 1 wherein said monitoring step further comprising monitoring a plurality of regions of plasma emission intensity.

10. The method of claim 9 wherein said plurality of regions of plasma emission intensity are background corrected.

11. The method of claim 9 wherein said monitoring step further comprising performing mathematical operations on said multiple regions of plasma emission intensity.

12. The method of claim 9 wherein said plurality of regions of plasma emission intensity are chosen using an off-line analysis.

13. The method of claim 12 wherein said off-line analysis further comprising spectra differencing.

14. The method of claim 9 wherein said plurality of regions of plasma emission intensity are chosen using a statistical method.

15. The method of claim 14 wherein said statistical method further comprising factor analysis.

16. The method of claim 1 wherein said extracting step further comprising using a plurality of peak detect algorithms.

17. The method of claim 16 wherein said plurality of peak detect algorithms are reset sequentially in a round robin fashion.

18. The method of claim 17 wherein said reset further comprising a clock period that is longer than a half period of a lowest frequency of interest.

19. A method of establishing endpoint during a time division multiplex process comprising the steps of:
    subjecting a substrate to the time division multiplex process;
    monitoring an attribute of a signal generated from the time division multiplex process;
    processing said attribute of the periodic signal generated from the time division multiplex process using an envelope follower; and
    discontinuing the time division multiplex process at a time based on the processing step.

20. The method of claim 19 wherein said attribute is plasma impedance.

21. The method of claim 19 wherein said processing step further comprising using a plurality of peak detect algorithms.

22. The method of claim 21 wherein said plurality of peak detect algorithms are processed in parallel.

23. The method of claim 21 wherein said plurality of peak detect algorithms are reset sequentially in a round robin fashion.

24. The method of claim 23 wherein said reset further comprising a clock period that is at least half the process period of the time division multiplex process.

25. The method of claim 19 wherein said attribute is plasma emission intensity.

26. The method of claim 25 wherein said monitoring step further comprising monitoring a plurality of regions of plasma emission intensity.

27. The method of claim 26 wherein said plurality of regions of plasma emission intensity are background corrected.

28. The method of claim 26 wherein said monitoring step further comprising performing mathematical operations on said multiple regions of plasma emission intensity.

29. The method of claim 26 wherein said plurality of regions of plasma emission intensity are chosen using a statistical method.

30. The method of claim 29 wherein said statistical method further comprising factor analysis.

31. The method of claim 26 wherein said plurality of regions of plasma emission intensity are chosen using an off-line analysis.

32. The method of claim 31 wherein said off-line analysis further comprising spectra differencing.

33. The method of claim 19 wherein said processing step further comprising post processing of an extracted amplitude detection signal.

34. The method of claim 33 wherein said post processing is digital signal processing.

35. The method of claim 34 wherein said digital signal processing comprises a filter.

36. The method of claim 35 wherein said filter is an infinite impulse response filter.

37. The method of claim 35 wherein said filter is a finite impulse response filter.

38. A method for establishing endpoint during a time division multiplexed process, the method comprising the steps of:

a. etching a surface of a substrate in an etching step by contact with a reactive etching gas to removed material from the surface of the substrate and provide exposed surfaces;
b. passivating the surface of the substrate in a passivating step during which the surfaces that were exposed in the preceding etching step are covered by a passivation layer thereby forming a temporary etching stop;
c. alternatingly repeating the etching step and the passivating step;
d. analyzing an intensity of at least one wavelength region of a plasma emission through the use of an envelope follower algorithm; and
e. discontinuing the time division multiplexed process at a time which is dependent on said analysis step.

39. A method of establishing endpoint during a time division multiplex process comprising the steps of:
subjecting a substrate to the time division multiplex process;
monitoring an attribute of a signal generated from the time division multiplex process;
processing said attribute of the periodic signal generated from the time division multiplex process using a peak-hold and decay algorithm; and
discontinuing the time division multiplex process at a time based on the processing step.

40. The method of claim 39 wherein said attribute is plasma emission intensity.

41. The method of claim 39 wherein said processing step further comprising using a linear decay algorithm.

42. The method of claim 39 wherein said processing step further comprising using a non-linear decay algorithm.

43. The method of claim 39 wherein said processing step further comprising post processing of an extracted amplitude detection signal.

44. The method of claim 43 wherein said post processing is digital signal processing.

45. The method of claim 44 wherein said digital signal processing comprises a filter.

46. The method of claim 45 wherein said filter is an infinite impulse response filter.

47. The method of claim 45 wherein said filter is a finite impulse response filter.

* * * * *